(12) United States Patent
Oh et al.

(10) Patent No.: US 12,295,232 B2
(45) Date of Patent: May 6, 2025

(54) ELECTRONIC DEVICE

(71) Applicants: SAMSUNG DISPLAY CO., LTD., Yongin-si (KR); Seoul National University R&DB Foundation, Seoul (KR)

(72) Inventors: Jungsuek Oh, Seoul (KR); Jae-Kyoung Kim, Hwaseong-si (KR); Seongryong Lee, Hwaseong-si (KR); Byeongjin Kim, Seoul (KR); Jeongtaek Oh, Seoul (KR)

(73) Assignees: SAMSUNG DISPLAY CO., LTD., Gyeonggi-Do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 17/462,813

(22) Filed: Aug. 31, 2021

(65) Prior Publication Data

US 2022/0208861 A1  Jun. 30, 2022

(30) Foreign Application Priority Data

Dec. 30, 2020  (KR) .......................... 10-2020-0188416

(51) Int. Cl.
*H10K 59/40* (2023.01)
*G06F 3/041* (2006.01)
(Continued)

(52) U.S. Cl.
CPC .......... *H10K 59/40* (2023.02); *G06F 3/0412* (2013.01); *G06F 3/0446* (2019.05); *H01Q 1/243* (2013.01); *G06F 2203/04112* (2013.01)

(58) Field of Classification Search
CPC ...... H01Q 1/243; H01Q 1/44; H01Q 21/0006; H01Q 21/065; H01Q 21/24; H01Q 25/001;
(Continued)

(56) References Cited

U.S. PATENT DOCUMENTS

| 2018/0149920 A1* | 5/2018 | Yamazaki ............. G02F 1/1343 |
| 2019/0058264 A1 | 2/2019 | Jung et al. |

(Continued)

FOREIGN PATENT DOCUMENTS

| KR | 101818970 B1 | 1/2018 |
| KR | 1020190019802 A | 2/2019 |

(Continued)

*Primary Examiner* — Robin J Mishler
(74) *Attorney, Agent, or Firm* — CANTOR COLBURN LLP

(57) ABSTRACT

An electronic device includes: a display layer in which an active area and a peripheral area adjacent to the active area are defined, the display layer including a common electrode, a sensor layer disposed on the display layer and including a plurality of sensing electrodes and an antenna pattern, and a cover layer spaced apart from the sensor layer with the display layer therebetween, the cover layer having a conductivity. The peripheral area includes a first area and a second area spaced apart from the active area with the first area therebetween, and the common electrode is disposed in the active area and the first area and is spaced apart from the second area. When viewed in a plan view, a portion of the antenna pattern does not overlap the common electrode and overlaps the cover layer.

13 Claims, 17 Drawing Sheets

(51) Int. Cl.
*G06F 3/044* (2006.01)
*H01Q 1/24* (2006.01)

(58) Field of Classification Search
CPC .... H01Q 9/0435; H01Q 9/285; H01L 27/323; G06F 3/0446; G06F 3/0412; G06F 2203/04112; G06F 2203/04103; G06F 2203/04111; G06F 3/04164; H10K 59/40; H10K 59/8052; H10K 59/8731
See application file for complete search history.

(56) References Cited

U.S. PATENT DOCUMENTS

| | | | | |
|---|---|---|---|---|
| 2020/0127404 | A1* | 4/2020 | Seo | H01Q 21/065 |
| 2020/0227819 | A1* | 7/2020 | Oh | H04M 1/0266 |
| 2020/0251807 | A1* | 8/2020 | Oh | H01Q 9/0407 |
| 2021/0013626 | A1* | 1/2021 | Jang | H01Q 1/38 |
| 2021/0200379 | A1* | 7/2021 | Youk | H01Q 1/38 |

FOREIGN PATENT DOCUMENTS

| | | |
|---|---|---|
| KR | 101971070 B1 | 4/2019 |
| KR | 1020190069226 A | 6/2019 |
| KR | 1020200112755 A | 10/2020 |
| KR | 1020200143628 A | 12/2020 |

\* cited by examiner

ELECTRONIC DEVICE

This application claims priority to Korean Patent Application No. 10-2020-0188416, filed on Dec. 30, 2020, and all the benefits accruing therefrom under 35 U.S.C. § 119, the content of which in its entirety is herein incorporated by reference.

BACKGROUND

1. Field

The disclosure herein relates to an electronic device having improved frequency signal radiation performance.

2. Description of the Related Art

An electronic device may include electronic modules. For example, the electronic device may be a portable terminal or a wearable device, and the electronic modules may include an antenna module, a camera module, or a battery module. As the portable terminal becomes thinner, and the wearable device is miniaturized, a space in which the electronic modules are mounted is gradually decreasing. In addition, as the electronic device has higher functionalization and higher specification, the number of electronic modules in the electronic device is increasing.

SUMMARY

The disclosure provide an electronic device having improved frequency signal radiation performance.

An embodiment of the invention provides an electronic device including: a display layer in which an active area and a peripheral area adjacent to the active area are defined, where the display layer includes a common electrode; a sensor layer disposed on the display layer, where the sensor layer includes a plurality of sensing electrodes and an antenna pattern; and a cover layer spaced apart from the sensor layer with the display layer therebetween, where the cover layer has a conductivity. In such an embodiment, the peripheral area includes a first area and a second area spaced apart from the active area with the first area therebetween, the common electrode is disposed in the active area and the first area and is spaced apart from the second area. In such an embodiment, when viewed in a plan view, a portion of the antenna pattern does not overlap the common electrode, and when viewed in the plan view, the portion of the antenna pattern overlaps the cover layer.

In an embodiment, when viewed in the plan view, the portion of the antenna pattern may overlap the second area.

In an embodiment, when viewed in the plan view, the antenna pattern may not overlap the common electrode.

In an embodiment, the antenna pattern may include a first portion and a second portion adjacent to the first portion, and the second portion may have a mesh structure.

In an embodiment, the antenna pattern may include a dipole antenna.

In an embodiment, when viewed in the plan view, the first portion may overlap the second area, and when viewed in the plan view, the second portion may overlap the first area.

In an embodiment, the second portion may surround the first portion. In such an embodiment, when viewed in the plan view, the first portion may overlap the second area, and when viewed in the plan view, the second portion may overlap the first area and the second area.

In an embodiment, the antenna pattern may further include a third portion extending from the first portion, and when viewed in the plan view, a distance by which the first portion is spaced apart from a side surface of the sensor layer may be greater than a distance by which the third portion is spaced apart from the side surface of the sensor layer.

In an embodiment, when viewed in the plan view, the first portion, the second portion and the third portion may overlap the second area.

In an embodiment, when viewed in the plan view, the first portion and the third portion may overlap the first area, and when viewed in the plan view, the second portion may overlap the first area and the second area.

In an embodiment, a groove may be defined in the common electrode in a direction away from a side surface of the display layer, and when viewed in the plan view, the antenna pattern may be disposed in the groove and be spaced apart from the common electrode.

In an embodiment, the common electrode may include a first electrode portion overlapping the active area and a second electrode portion overlapping the first area, where a plurality of openings may be defined in the second electrode portion.

In an embodiment, a plurality of openings may be defined in the common electrode.

In an embodiment, the second area may have a width of about 300 micrometers ($\mu$m) or greater.

In an embodiment, the electronic device may further include a protective layer disposed between the cover layer and the display layer.

In an embodiment, at least some of the plurality of sensing electrodes and the antenna pattern may be disposed in a same layer as each other.

In an embodiment, when viewed in the plan view, the antenna pattern may overlap the active area and the peripheral area, and a portion of the antenna pattern, which overlaps the active area, may have a mesh structure.

In an embodiment of the invention, an electronic device includes: a sensor layer including a plurality of sensing electrodes and an antenna pattern disposed in a same layer as some of the plurality of sensing electrodes; a display layer disposed below the sensor layer, where the display layer includes a common electrode; and a cover layer disposed below the display layer and having a conductivity, wherein, when viewed in a plan view, a portion of the antenna pattern does not overlap the common electrode and overlaps the cover layer.

In an embodiment, a distance between a side surface of the display layer and the common electrode may be about 300 $\mu$m or greater.

In an embodiment, the electronic device may further include a protective layer disposed between the cover layer and the display layer.

BRIEF DESCRIPTION OF THE FIGURES

The above and other features of the invention will become more apparent by describing in further detail embodiments thereof with reference to the accompanying drawings, in which.

DETAILED DESCRIPTION

Figure 1:
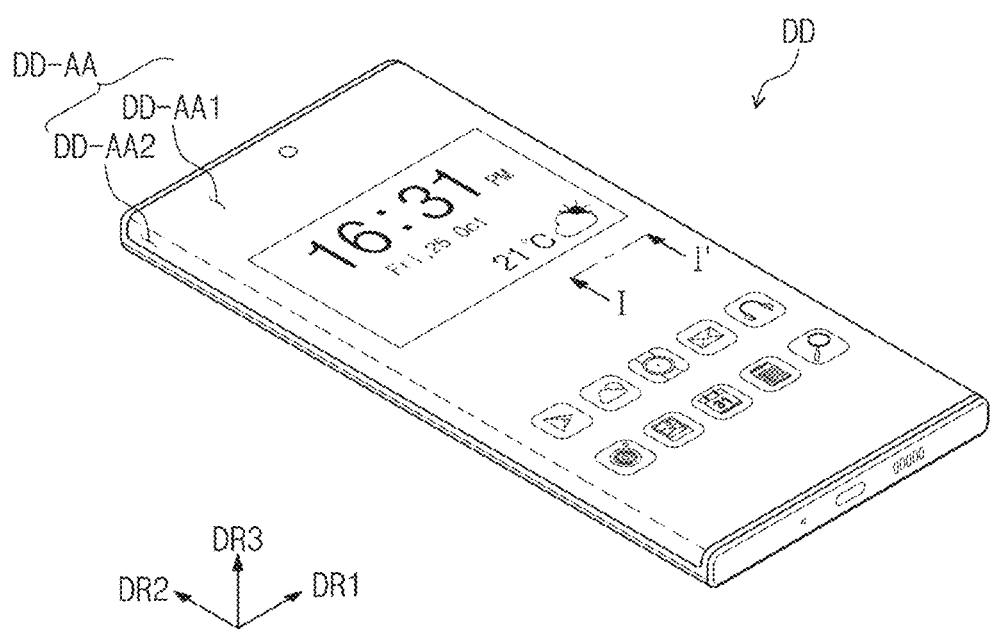
FIG. 1 is a perspective view of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or area, layer, portion) is referred to as being "on", "connected to", or "coupled to" another component, it can be directly disposed/connected/coupled on/to the one component, or an intervening third component may also be present. In contrast, when an element is referred to as being "directly on", "connected directly to", or "coupled directly to" another element, there are no intervening elements present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view of an electronic device according to an embodiment of the invention.

Referring to FIG. 1, an embodiment of an electronic device DD may be a device that is activated according to an electrical signal. In one embodiment, for example, the electronic device DD may be a mobile phone, a tablet personal computer ("PC"), a navigation system, a game console, or a wearable device, but is not limited thereto. FIG. 1 illustrates an embodiment in which the electronic device DD is a mobile phone.

The electronic device DD may display an image through an active area DD-AA. A first display surface DD-AA1 parallel to a surface defined by a first direction DR1 and a second direction crossing the first direction DR1, and a second display surface DD-AA2 extending from the first display surface DD-AA1 may be defined on the active area DD-AA.

The second display surface DD-AA2 may be bent from one side of the first display surface DD-AA1. Alternatively, the second display surface DD-AA2 may be provided in plural. In such an embodiment, the second display surfaces DD-AA2 may be bent from at least two sides of the first display surface DD-AA1.

One first display surface DD-AA1 and one or more and not more than four second display surfaces DD-AA2 may be defined on the active area DD-AA. However, the shape of the active area DD-AA is not limited thereto, and alternatively, only the first display surface DD-AA1 may be defined on the active area DD-AA and the second display surface DD-AA2 may be omitted.

A thickness direction of the electronic device DD may be parallel to a third direction DR3 crossing the first direction DR1 and the second direction DR2. Thus, a front surface (or top surface) and a rear surface (or bottom surface) of each of members constituting the electronic device DD may be defined based on the third direction DR3.

Figure 2:
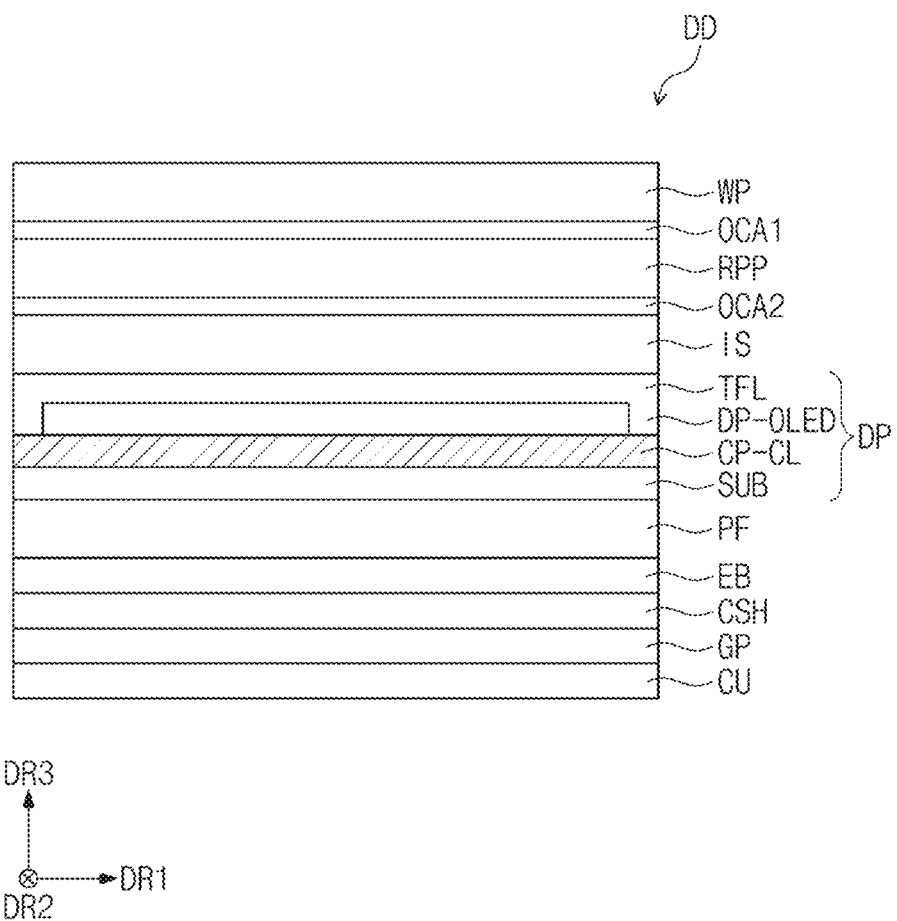
FIG. 2 is a schematic cross-sectional view of the electronic device according to an embodiment of the invention.

FIG. 2 is a schematic cross-sectional view of the electronic device according to an embodiment of the invention.

Referring to FIG. 2, an embodiment of the electronic device DD may include a window WP, adhesive layers OCA1, OCA2, and OCA3, an anti-reflection layer RPP, a sensor layer IS, a display layer DP, a protective layer PF, an emboss layer EB, a cushion layer CSH, a heat dissipation sheet GP, and a cover layer CU.

The window WP may define an outer or uppermost appearance of the electronic device DD. The window WP may protect internal constituents of the electronic device DD from an external impact and may substantially provide the active area DD-AA of the electronic device DD. In one embodiment, for example, the window WP may include a glass substrate, a sapphire substrate, or a plastic film. The window WP may have a multilayered or single-layered structure. In one embodiment, for example, the window WP may have a laminated structure of a plurality of plastic films bonded to each other by an adhesive or a laminated structure of a glass substrate and a plastic film, which are bonded to each other by an adhesive.

The adhesive layer OCA1 may be disposed below the window WP. The window WP and the anti-reflection layer RPP may be bonded to each other by the adhesive layer OCA1. The adhesive layer OCA1 may include a typical or conventional adhesive or sensitive agent. In one embodiment, for example, the adhesive layer OCA1 may be an optically clear adhesive film, an optically clear adhesive resin, or a pressure sensitive adhesive film.

The anti-reflection layer RPP may be disposed below the window WP. The anti-reflection layer RPP may reduce reflectance of external light (e.g., sunlight) incident from an upper side of the window WP.

In an embodiment, the anti-reflection layer RPP may include a retarder and a polarizer. The retarder may be a film type or liquid crystal coating type retarder and may include a $\lambda/2$ retarder and/or a $\lambda/4$ retarder. The polarizer may be provided in a film type or liquid crystal coating type polarizer. The film type may include an elongation-type synthetic resin, and the liquid crystal coating type may include liquid crystals that are arranged in a predetermined arrangement. Each of the retarder and the polarizer may further include a protection film. The retarder and polarizer collectively or the protection film may define or function as a base layer of the anti-reflection layer RPP.

The adhesive layer OCA2 may be disposed below the anti-reflection layer RPP. The anti-reflection layer RPP and the sensor layer IS may be bonded to each other by the adhesive layer OCA2. The adhesive layer OCA2 may include substantially a same material as the adhesive layer OCA1.

The sensor layer IS may acquire coordinate information of an external input. In an embodiment, the sensor layer IS may be disposed directly on one surface of the display layer DP. In one embodiment, for example, the sensor layer IS may be integrated with the display layer DP in an on-cell manner. The sensor layer IS and the display layer DP may be manufactured through a continuous process. However, the embodiment of the invention is not limited thereto, and alternatively, the sensor layer IS may be manufactured by a separate process to adhere to the display layer DP. The sensor layer IS may include a touch panel.

The sensor layer IS may transmit, receive, or transmit/receive a wireless communication signal, for example, a radio frequency signal. The sensor layer IS may include a plurality of antenna patterns and a plurality of antenna pads. The plurality of antenna patterns may transmit, receive, or transmit/receive signals having a same frequency band as each other or may transmit, receive, or transmit/receive signals having different frequency bands from each other. The plurality of antenna patterns and the plurality of antenna pads will be described later in greater detail.

The display layer DP may be disposed below the sensor layer IS. The display layer DP may be configured to substantially generate an image. The display layer DP may be an emission-type display layer. However, the embodiment of the invention is not limited thereto. In one embodiment, for example, the display layer DP may include an organic light emitting display layer, a quantum dot display layer, a micro light emitting diode ("LED") display layer, or a nano LED display layer. The display layer DP may include a base layer SUB, a display circuit layer DP-CL, an image implementation layer DP-OLED, and a thin film encapsulation layer TFL, which will be described later in greater detail.

A protective layer PF may be disposed below the display layer DP. The protective layer PF may protect a bottom surface of the display layer DP. The protective layer PF may include polyethylene terephthalate ("PET"), for example. However, the material of the protective layer PF is not particularly limited thereto.

The emboss layer EB may be disposed below the protective layer PF. The emboss layer EB may be colored or have a predetermined color. In one embodiment, for example, the emboss layer EB may have a black color. The emboss layer EB may absorb light incident thereonto. The emboss layer EB may be a layer having adhesiveness on opposing sides thereof. The emboss layer EB may include a typical or conventional adhesive or sticking agent. The protective layer PF and the cushion layer CSH may be bonded to each other by the emboss layer EB.

The cushion layer CSH may be disposed below the emboss layer EB. The cushion layer CSH may have a function to relieve a pressure applied from the outside. The cushion layer CSH may include a sponge, foam, or a urethane resin. The cushion layer CSH may has a thickness greater than that of the emboss layer EB.

The heat dissipation sheet GP may be disposed below the cushion layer CSH. The heat dissipation sheet GP may induce emission of heat generated from the display layer DP. In one embodiment, for example, the heat dissipation sheet GP may be a graphite sheet. In an embodiment of the invention, a film layer may be further disposed between the cushion layer CSH and the heat dissipation sheet GP. The film layer may include polyimide ("PI").

The cover layer CU may be disposed below the protective layer PF. The cover layer CU may have conductivity. In one embodiment, for example, the cover layer CU may include copper (Cu). In one embodiment, for example, the cover layer CU may be a copper tape. However, the embodiment of the invention is not particularly limited thereto. A ground voltage may be applied to the cover layer CU. However, this is merely an example, and the cover layer CU may be floated, which will be described later in greater detail.

Figure 3:
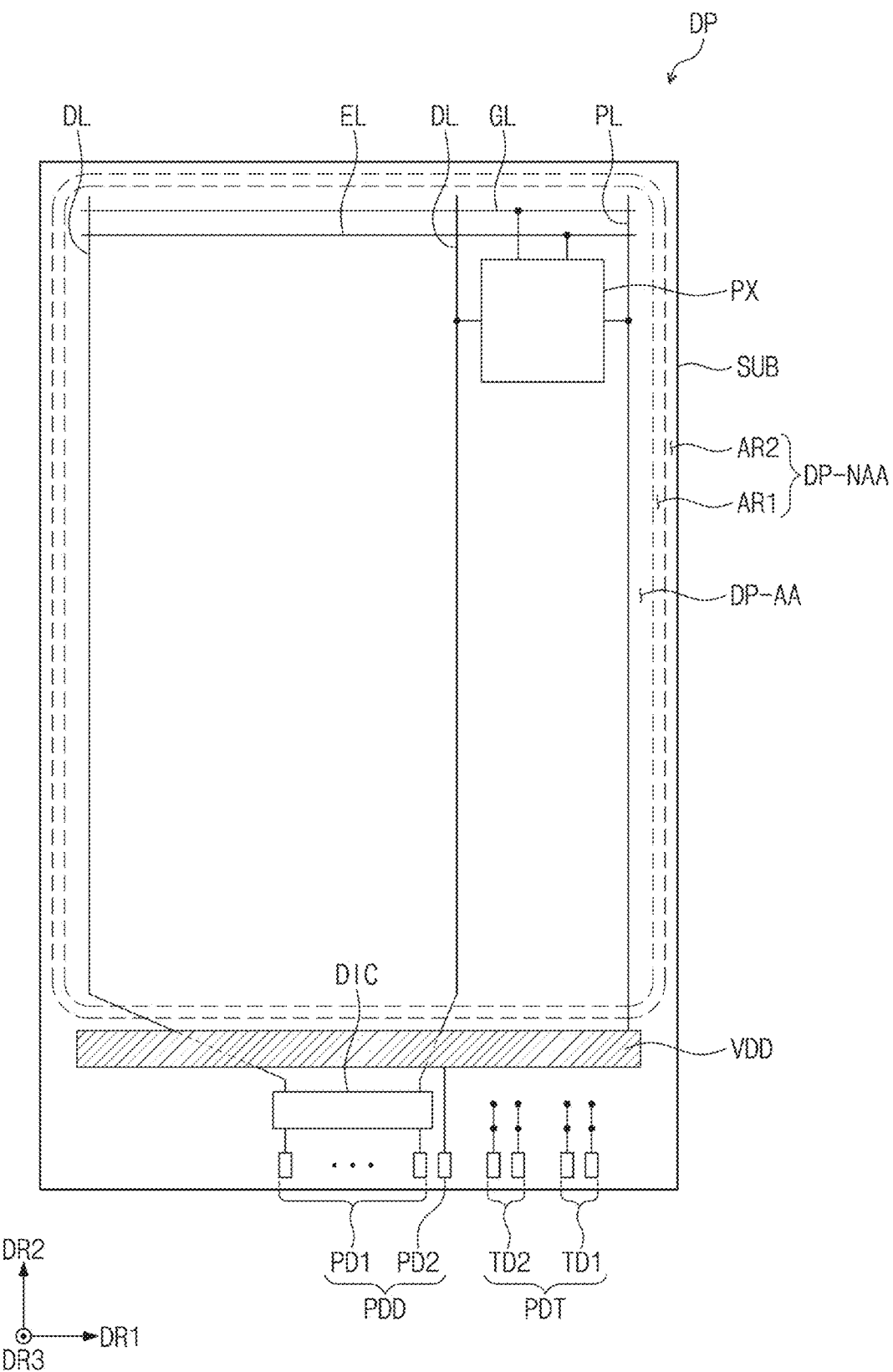
FIG. 3 is a plan view of a display layer according to an embodiment of the invention.

FIG. 3 is a plan view of the display layer according to an embodiment of the invention.

Referring to FIG. 3, in an embodiment, an active area DP-AA and a peripheral area DP-NAA adjacent to the active area DP-AA may be defined in the display layer DP. The active area DP-AA may be an area on which an image is displayed. A plurality of pixels PX may be disposed in the active area DP-AA. The peripheral area DP-NAA may be an area in which a driving circuit or driving line is disposed. When viewed in a plan view in the third direction DR3 or a thickness direction of the display layer DP, the active area DP-AA may overlap the active area DD-AA (see FIG. 1) of the electronic device DD (see FIG. 1), and the peripheral area DP-NAA may overlap the peripheral area DD-NAA (see FIG. 1) of the electronic device DD (see FIG. 1).

The peripheral area DP-NAA may include a first area AR1 and a second area AR2. The first area AR1 may surround the active area DP-AA. The second area AR2 may be spaced apart from the active area DP-AA with the first area AR1 therebetween. The second area AR2 may surround the first area AR1.

The display layer DP may include a base layer SUB, a plurality of pixels PX, a plurality of signal lines GL, DL, PL, and EL, a plurality of display pads PDD, and a plurality of sensing pads PDT.

In an embodiment, the active area DP-AA and the peripheral area DP-NAA may be defined on the base layer SUB. Each of the pixels PX may display one of primary colors or one of mixed colors. The primary colors may include a red, green, or blue color. The mixed color may include various colors such as white, yellow, cyan, or magenta. However, the embodiment of the invention is not limited to the colors displayed by the pixels PX described above.

A plurality of signal lines GL, DL, PL, and EL may be disposed on the base layer SUB. The plurality of signal lines GL, DL, PL, and EL may be connected to the plurality of pixels PX to transmit an electrical signal to the plurality of pixels PX. The plurality of signal lines GL, DL, PL, and EL include a plurality of scan lines GL, a plurality of data lines DL, a plurality of power lines PL, and a plurality of emission control lines EL. However, this is merely an example, and the configurations of the signal lines GL, DL, PL, and EL in an embodiment of the invention is not limited thereto. In one alternative embodiment, for example, the plurality of signal lines GL, DL, PL, and EL may further include an initialization voltage line.

The power pattern VDD may be disposed on the peripheral area DP-NAA. The power pattern VDD may be connected to the plurality of power lines PL. In such an embodiment where the display layer DP includes the power pattern VDD, a same power signal may be provided to the plurality of pixels PX.

The plurality of display pads PDD may be disposed on the peripheral area DP-NAA. The plurality of display pads PDD may include a first pad PD1 and a second pad PD2. The first pad PD1 may be provided in plural. The plurality of first pads PD1 may be connected to the plurality of data lines DL, respectively. The second pad PD2 may be connected to the power pattern VDD and electrically connected to the power line PL. The display layer DP may provide electrical signals provided from the outside to the plurality of pixels PX through the plurality of display pads PDD. The plurality of display pads PDD may further include pads for receiving other electrical signals in addition to the first pad PD1 and the second pad PD2, but are not limited to a specific embodiment.

The driving circuit DIC may be disposed or mounted on the peripheral area DP-NAA. The driving circuit DIC may be a timing control circuit in the form of a chip. The plurality of data lines DL may be electrically connected to the plurality of first pads PD1 through the driving circuit DIC, respectively. However, this is merely an example, and alternatively, the driving circuit DIC may be mounted on a film that is separate from the display layer DP. In such an embodiment, the driving circuit DIC may be electrically connected to the plurality of display pads PDD through the film.

The plurality of sensing pads PDT may be disposed on the peripheral area DP-NAA. The plurality of sensing pads PDT may be electrically connected to a plurality of sensing electrodes of the sensor layer IS (see FIG. 3) to be described later. The plurality of sensing pads PDT may include a plurality of first sensing pads TD1 and a plurality of second sensing pads TD2.

Figure 4:
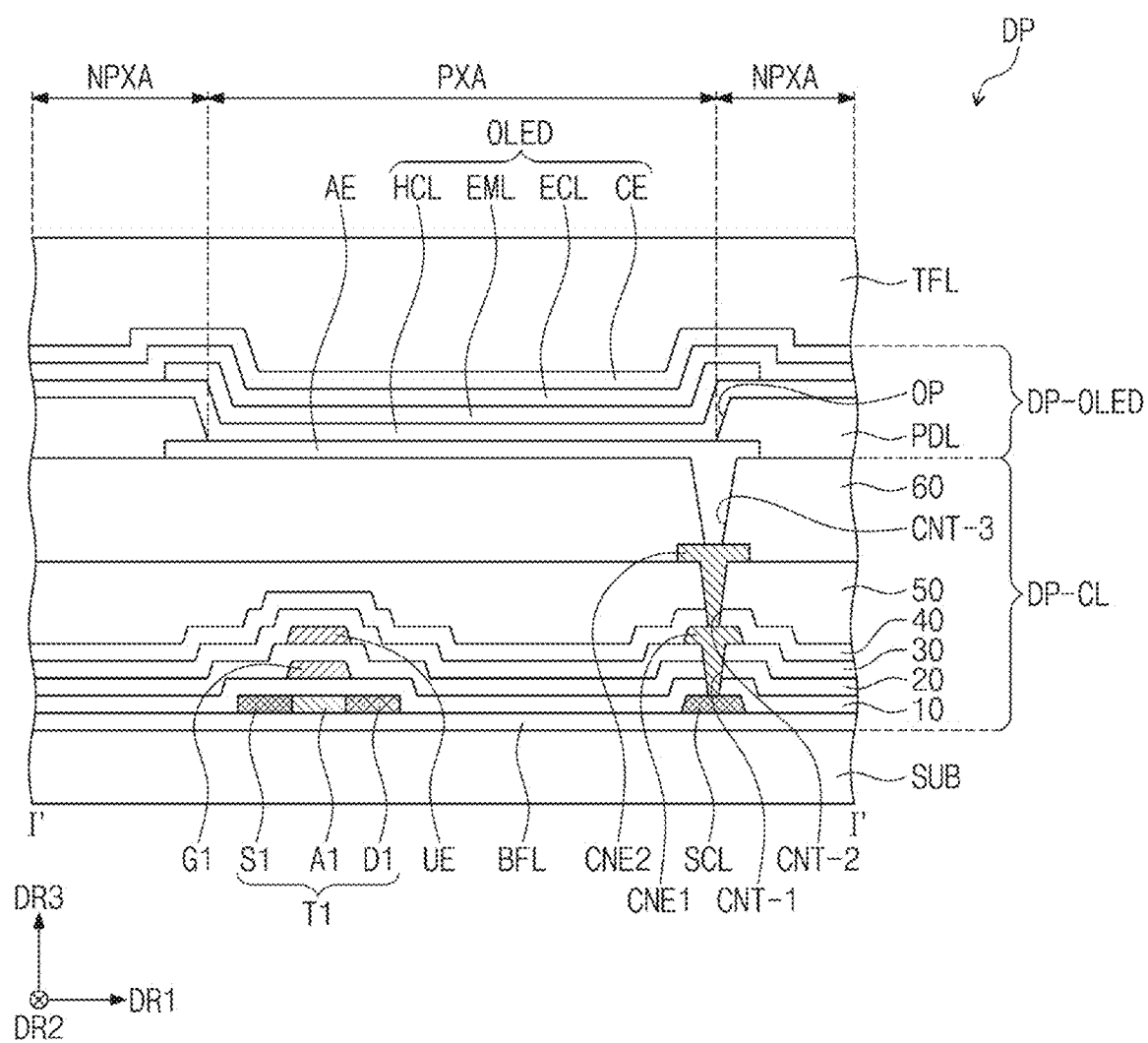
FIG. 4 is a cross-sectional view taken along line I-I' of FIG. 1, showing a portion of the display layer, according to an embodiment of the invention.

FIG. 4 is a cross-sectional view taken along line I-I' of FIG. 1A, showing a portion of the display layer, according to an embodiment of the invention.

Referring to FIG. 4, an embodiment of the display layer DP may include a base layer SUB, a display circuit layer DP-CL, an image realization layer DP-OLED, and a thin film encapsulation layer TFL. The display layer DP may include a plurality of insulating layers, a semiconductor pattern, a conductive pattern, a signal line, or the like. In an embodiment, the insulating layer, the semiconductor layer, and the conductive layer may be formed in a manner such as coating or vapor deposition. Thereafter, the insulating layer, the semiconductor layer, and the conductive layer may be selectively patterned in a photolithography manner. In such an embodiment, the semiconductor patterns, the conductive pattern, the signal line, or the like, which are provided in the display circuit layer DP-CL and the image realization layer DP-OLED may be formed. The base layer SUB may be a base substrate for supporting the display circuit layer DP-CL and the image realization layer DP-OLED.

The base layer SUB may include a synthetic resin layer. The synthetic resin layer may include a thermosetting resin. The base layer SUB may have a multi-layered structure. In one embodiment, for example, the base layer SUB includes a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

The display circuit layer DP-CL may be disposed on the base layer SUB. The display circuit layer DP-CL may provide a signal for driving a light emitting element OLED in the image realization layer DP-OLED. The display circuit layer DP-CL may include the buffer layer BFL, a transistor T1, a first insulating layer 10, a second insulating layer 20, and a third insulating layer 30, a fourth insulating layer 40, a fifth insulating layer 50, and a sixth insulating layer 60.

The buffer layer BFL may improve bonding force between the base layer SUB and the semiconductor pattern. In an embodiment, the buffer layer BFL may include a silicon oxide layer and a silicon nitride layer, for example. In such an embodiment, the silicon oxide layer and the silicon nitride layer may be alternately laminated with each other.

A semiconductor pattern may be disposed on the buffer layer BFL. In an embodiment, the semiconductor pattern may include polysilicon. However, the embodiment of the invention is not limited thereto. In one alternative embodiment, for example, the semiconductor pattern may include amorphous silicon or metal oxide.

FIG. 4 illustrates merely a portion of the semiconductor pattern. In one embodiment, for example, the semiconductor pattern may be further disposed on other areas of the pixel PX on the plane. The semiconductor pattern may be arranged in a specific manner over the plurality of pixels PX. The semiconductor pattern has different electrical properties depending on whether the semiconductor pattern is doped. The semiconductor pattern may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or may be doped at a concentration less than that of the first region.

The first region may have conductivity greater than that of the second region and may substantially serve as an electrode or a signal line. The second region may substantially correspond to an active (or channel) of the transistor. In such an embodiment, a portion of the semiconductor pattern may be an active of the transistor, another portion may be a source or drain of the transistor, and further another portion may be a connection electrode or a connection signal line.

Each of the plurality of pixels PX (see FIG. 3) may have an equivalent circuit including seven transistors, one capacitor, and a light emitting element, and an equivalent circuit of the pixel may be modified in various forms. In an embodiment, the two transistors, one capacitor, and the light emitting element OLED may be provided in each of the plurality of pixels PX. In such an embodiment, the first transistor T1 of the two transistors (shown in FIG. 4) may include a source S1, an active A1, a drain D1, and a gate G1, and the second transistor of the two transistors may include a source, an active, a drain, a gate, and an upper electrode. In such an embodiment, the capacitor may be defined by the gate G1 of the first transistor T1 and an upper electrode UE.

A source S1, an active A1, a drain D1 of the transistor T1 may be formed from (or defined by portions of) a semiconductor pattern. The source S1 and the drain D1 may extend in opposite directions from the active A1 on a cross-section. FIG. 4 illustrates a portion of a connection signal line SCL formed from the semiconductor pattern.

A first insulating layer 10 may be disposed on the buffer layer BFL. The first insulating layer 10 may commonly overlap the plurality of pixels PX and may cover the semiconductor pattern. The first insulating layer 10 may include an inorganic layer and/or an organic layer and have a single-layered or multilayered structure. The first insulating layer 10 may include at least one selected from oxide, titanium oxide, silicon oxide, silicon oxide nitride, zirconium oxide, and hafnium oxide. In an embodiment, the first insulating layer 10 may include a single-layered silicon oxide layer. The insulating layer of the circuit element layer DP-CL, which will be described later, as well as the first insulating layer 10 may be an inorganic layer and/or an organic layer and may have a single-layered or a multilayered structure. The inorganic layer may include at least one selected from the above-described materials.

A gate G1 may be disposed on the first insulating layer 10. The gate G1 may be a portion of a metal pattern. The gate G1 may overlap the active A1. In a process in which the semiconductor pattern is doped, the gate G1 may function as a mask.

A second insulating layer 20 may be disposed on the first insulating layer 10. The second insulating layer 20 may cover the gate G1. The second insulating layer 20 may commonly overlap the plurality of pixels PX. The second insulating layer 20 may be an inorganic layer and/or an organic layer and have a single-layered or multilayered structure. In an embodiment, the second insulating layer 20 may include a single-layered silicon oxide layer.

The upper electrode UE may be disposed on the second insulating layer 20. The upper electrode UE may overlap the gate G1. The upper electrode UE may be a portion of the metal pattern. A portion of the gate G1 and the upper electrode UE overlapping the portion of the gate G1 may define the capacitor. However, this is merely an example, and alternatively, the upper electrode UE may be omitted.

A third insulating layer 30 may be disposed on the second insulating layer 20. The third insulating layer 30 may cover the upper electrode UE. In an embodiment, the third insulating layer 30 may include a single-layered silicon oxide layer. The first connection electrode CNE1 may be disposed on the third insulating layer 30. The first connection electrode CNE1 may be connected to the signal line SCL through a contact hole CNT-1 defined through the first to third insulating layers 10, 20, and 30.

A fourth insulating layer 40 may be disposed on the third insulating layer 30. A fourth insulating layer 40 may cover the first connection electrode CNE1. In an embodiment, the fourth insulating layer 40 may be a single-layered silicon oxide layer.

A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 defined through the fourth insulating layer 40 and the fifth insulating layer 50.

A sixth insulating layer 60 may be disposed on the fifth insulating layer 50. The sixth insulating layer 60 may cover the second connection electrode CNE2. In an embodiment, the sixth insulating layer 60 may be an organic layer.

The image realization layer DP-OLED may include a first electrode AE, a pixel defining layer PDL, and a light emitting element OLED.

The first electrode AE may be disposed on the sixth insulating layer 60. The first electrode AE may be connected to the second connection electrode CNE2 through a contact hole CNT-3 defined through the sixth insulating layer 60. An opening OP may be defined in the pixel defining layer PDL.

The opening OP of the pixel defining layer PDL may expose at least a portion of the first electrode AE.

The active area DP-AA (see FIG. 3) may include an emission area PXA and a light blocking area NPXA adjacent to the emission area PXA. The light blocking area NPXA may surround the emission area PXA. In an embodiment, the emission area PXA may be defined to correspond to a portion of an area of the first electrode AE exposed by the opening OP.

A hole control layer HCL may be commonly disposed on the emission area PXA and the light blocking area NPXA. The hole control layer HCL may include a hole transport layer and may further include a hole injection layer. An emission layer EML may be disposed on the hole control layer HCL. The emission layer EML may be disposed on an area corresponding to the opening OP. In such an embodiment, the light emitting layer EML may be formed to be separated from each of the pixels PX.

An electronic control layer ECL may be disposed on the emission layer EML. The electron control layer ECL may include an electron transport layer and may further include an electron injection layer. The hole control layer HCL and the electron control layer ECL may be commonly formed in the plurality of pixels by using an open mask. The second electrode CE may be disposed on the electronic control layer ECL. The second electrode CE may have an integrated shape, which is integrally formed as a single unitary unit. The second electrode CE may be commonly disposed in the plurality of pixels PX. The second electrode CE may be referred to as a common electrode CE.

The thin film encapsulation layer TFL may be disposed on the image realization layer DP-OLED to cover the image realization layer DP-OLED. The thin film encapsulation layer TFL may include a first inorganic layer, an organic layer, and a second inorganic layer, which are sequentially laminated one on another in the third direction DR3. However, this is merely an example, and the thin film encapsulation layer TFL according to an embodiment of the invention is not limited thereto. In one alternative embodiment, for example, the thin film encapsulation layer TFL may further include a plurality of inorganic layers and a plurality of organic layers.

The first inorganic layer may prevent external moisture or oxygen from being penetrated into the image realization layer DP-OLED. In one embodiment, for example, the first inorganic layer may include silicon nitride, silicon oxide, or a combination thereof.

The organic layer may be disposed on the first inorganic layer to provide a flat surface. An uneven portion (e.g., a curved portion) of a top surface of the first inorganic layer or particles existing on the first inorganic layer may be covered by the organic layer. In one embodiment, for example, the organic layer may include an acrylic-based organic layer, but the embodiment of the invention is not limited thereto.

The second inorganic layer may be disposed on the organic layer to cover the organic layer. The second inorganic layer may effectively prevent moisture or the like, which is discharged from the organic layer, from being introduced to the outside by encapsulating the moisture or the like. The second inorganic layer may include silicon nitride, silicon oxide, or a combination thereof.

Figure 5:
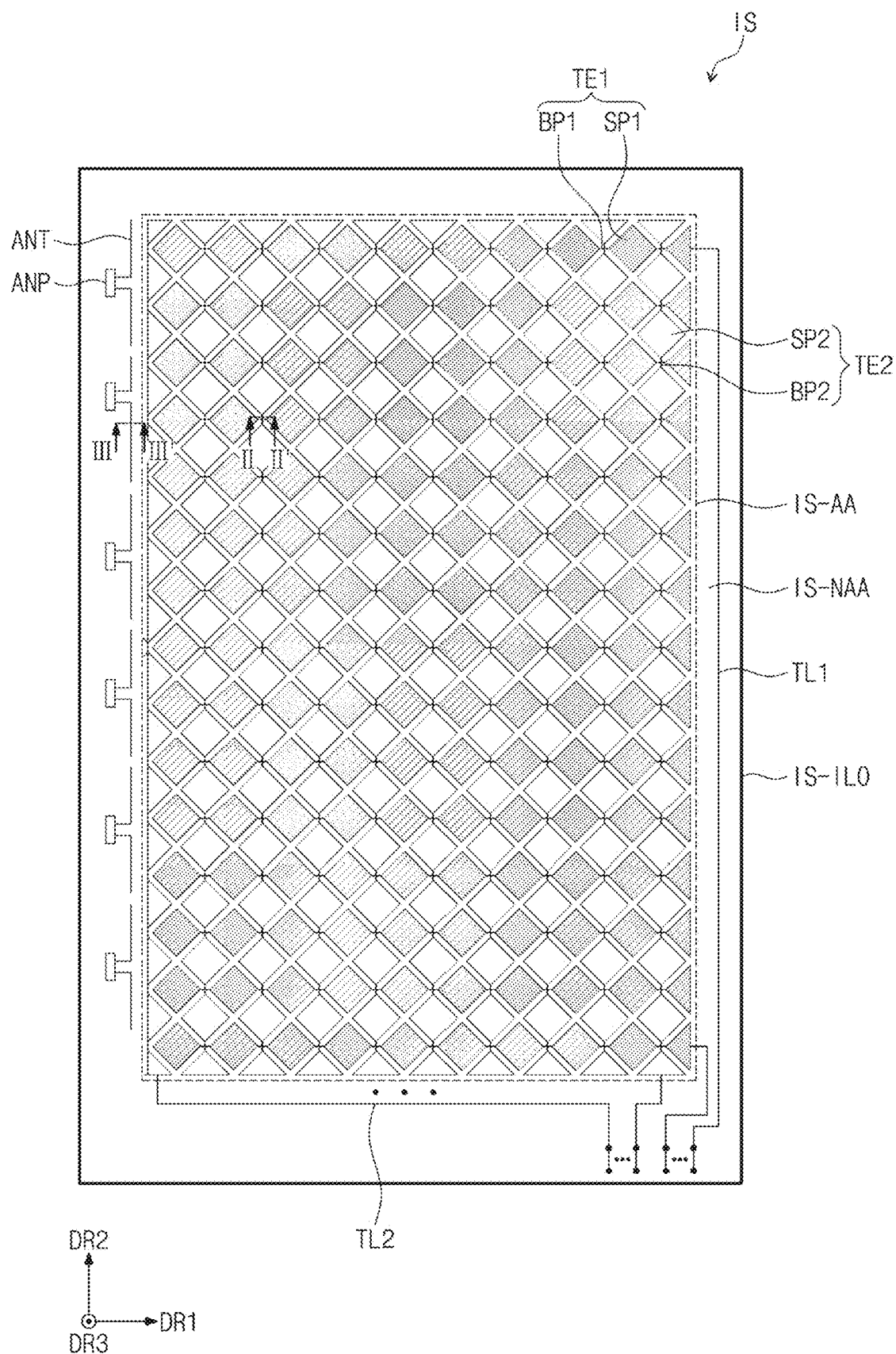
FIG. 5 is a plan view of a sensor layer according to an embodiment of the invention.

FIG. 5 is a plan view of the sensor layer according to an embodiment of the invention.

Referring to FIG. 5, an active area IS-AA and a peripheral area IS-NAA surrounding the active area IS-AA may be defined in the sensor layer IS. The active area IS-AA may be an area that is activated according to an electrical signal.

In one embodiment, for example, the active area IS-AA may be an area that senses an input. When viewed in the plan view in the third direction DR3, the active area IS-AA may overlap the active area DP-AA (see FIG. 3) of the display layer DP (see FIG. 3), and the peripheral area IS-NAA may overlap the peripheral area DP-NAA (see FIG. 3) of the display layer DP (see FIG. 3).

The sensor layer IS may include a base insulating layer IS-IL0, a plurality of first sensing electrodes TE1, a plurality of second sensing electrodes TE2, a plurality of sensing lines TL1 and TL2, a plurality of antenna patterns ANT, and a plurality of antenna pads ANP. The active area IS-AA and the peripheral area IS-NAA may be defined on the base insulating layer IS-IL0. The plurality of first sensing electrodes TE1 and the plurality of second sensing electrodes TE2 may be disposed on the active area IS-AA. The plurality of sensing lines TL1 and TL2 and the plurality of antenna pads ANP may be disposed on the peripheral area IS-NAA. At least some of the plurality of antenna patterns ANT may be disposed on the peripheral area IS-NAA.

The base insulating layer 2000 may be an inorganic layer including at least one selected from silicon nitride, silicon oxynitride, and silicon oxide. Alternatively, the base insulating layer IS-IL0 may be an organic layer including an epoxy resin, an acrylic resin, or an imide-based resin. The base insulating layer IS-IL0 may be disposed directly on the display layer DP (see FIG. 3). Alternatively, the base insulating layer IS-IL0 may be coupled to the display layer DP (see FIG. 3) through an adhesive member.

The sensor layer IS may acquire information on an external input through a change in capacitance between the plurality of first sensing electrodes TE1 and the plurality of second sensing electrodes TE2.

Each of the plurality of first sensing electrodes TE1 may extend in the first direction DR1, and the plurality of first sensing electrodes TE1 may be arranged in the second direction DR2. Each of the plurality of first sensing electrodes TE1 may include a plurality of sensing patterns SP1 and a plurality of bridge patterns BP1. Each of the plurality of bridge patterns BP1 may electrically connect two adjacent sensing patterns SP1 to each other. The plurality of sensing patterns SP1 and the plurality of bridge patterns BP1 may have a mesh structure.

Each of the second sensing electrodes TE2 may extend in the second direction DR2, and the plurality of second sensing electrodes TE2 may be arranged in the first direction DR1. Each of the plurality of second sensing electrodes TE2 may include a plurality of first portions SP2 and a plurality of second portions BP2. Each of the plurality of second portions BP2 may electrically connect two adjacent first portions SP2 to each other. The plurality of first portions SP2 may have a mesh structure.

FIG. 5 illustrates an embodiment where two second portions BP2 are connected to two adjacent first portions SP2, but the connection relationship between each of the plurality of second portions BP2 and each of the plurality of first portions SP2 according to an embodiment of the invention is not limited thereto. In one alternative embodiment, for example, two first portions SP2 adjacent to each other may be connected to each other by two second portions BP2.

The plurality of bridge patterns BP1 may be disposed on a layer different from that on which the plurality of second portions BP2 are disposed. The plurality of second portions BP2 may insulatively cross the plurality of first sensing electrodes TE1, respectively. In one embodiment, for example, the plurality of bridge patterns BP1 may insulatively cross the plurality of second portions BP2, respectively.

The plurality of sensing lines TL1 and TL2 may include a plurality of first sensing lines TL1 and a plurality of second sensing lines TL2. The plurality of first sensing lines TL1 may be electrically connected to the plurality of first sensing electrodes TE1, respectively. The plurality of second sensing lines TL2 may be electrically connected to the plurality of second sensing electrodes TE2, respectively. Each of the plurality of sensing lines TL1 and TL2 may have a mesh structure.

The plurality of first sensing pads TD1 (see FIG. 3) may be electrically connected to the plurality of first sensing lines TL1 through contact holes, respectively. The plurality of second sensing pads TD2 (see FIG. 3) may be electrically connected to the plurality of second sensing lines TL2 through contact holes, respectively.

The plurality of antenna patterns ANT may be disposed on the peripheral area IS-NAA. FIG. 5 illustrates an embodiment where six antenna patterns ANT are arranged in the second direction DR2, but the arrangement relationship of the antenna patterns ANT according to an embodiment of the invention is not limited thereto.

Each of the plurality of antenna patterns ANT may include a dipole antenna. However, this is merely an example, and a kind of plurality of connection patterns ANT according to an embodiment of the invention is not limited thereto. In one alternative embodiment, for example, each of the plurality of antenna patterns ANT may include a patch antenna. This will be described later in greater detail.

The plurality of antenna patterns ANT may operate in a predetermined frequency band. The frequency band may include a resonant frequency. The resonant frequency may be about 29 gigahertz (GHz). However, this is merely an example, and the resonant frequency according to an embodiment of the invention is not limited thereto. In one embodiment, for example, the resonant frequency may be changed according to a frequency band of a signal to be communicated.

The plurality of antenna pads ANP may be connected to one side of the plurality of antenna patterns ANT, respectively.

Figure 6:
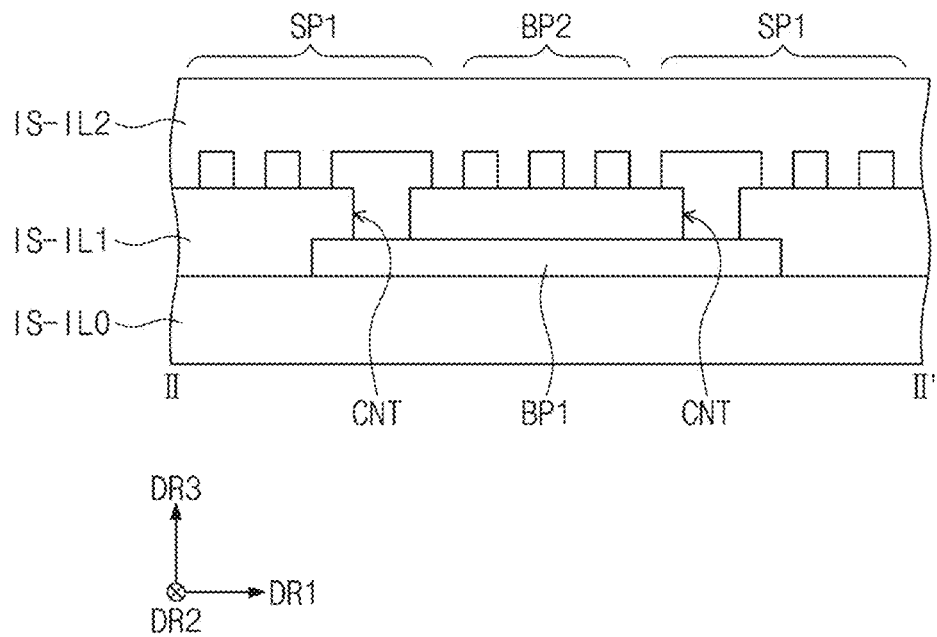
FIG. 6 is a cross-sectional view taken along line II-II' of FIG. 5 according to an embodiment of the invention.

FIG. 6 is a cross-sectional view taken along line II-II' of FIG. 5 according to an embodiment of the invention.

Referring to FIGS. 5 and 6, the plurality of bridge patterns BP1 may be disposed on the base insulating layer IS-IL0. The first insulating layer IS-IL1 may be disposed on the plurality of bridge patterns BP1. The first insulating layer IS-IL1 may has a single-layered or multilayered structure. The first insulating layer IS-IL1 may include an inorganic material, an organic material, or a composite material.

The plurality of sensing patterns SP1, the plurality of first portions SP2, and the plurality of second portions BP2 may be disposed on the first insulating layer IS-IL1. The plurality of sensing patterns SP1, the plurality of first portions SP2, and the plurality of second portions BP2 may have a mesh structure.

The plurality of contact holes CNT may be defined through the first insulating layer IS-IL1 in the third direction DR3. The two adjacent sensing patterns SP1 of the plurality of sensing patterns SP1 may be electrically connected to the bridge pattern BP1 through the plurality of contact holes CNT.

The second insulating layer IS-IL2 may be disposed on the plurality of sensing patterns SP1, the plurality of first portions SP2, and the plurality of second portions BP2. The third insulating layer IS-IL2 may have a single-layered or multilayered structure. The second insulating layer IS-IL2 may include an inorganic material, an organic material, or a composite material.

In an embodiment, as shown in FIG. 6, the sensor layer IS may have a bottom bridge structure, in which the plurality of bridge patterns BP1 are disposed below the plurality of sensing patterns SP1, the plurality of first portions SP2, and the plurality of second portions BP2, but is not limited thereto. In one alternative embodiment, for example, the sensor layer IS may have a top bridge structure in which the plurality of bridge patterns BP1 are disposed on the plurality of sensing patterns SP1, the plurality of first portions SP2, and the plurality of second portions BP2.

Figure 7:
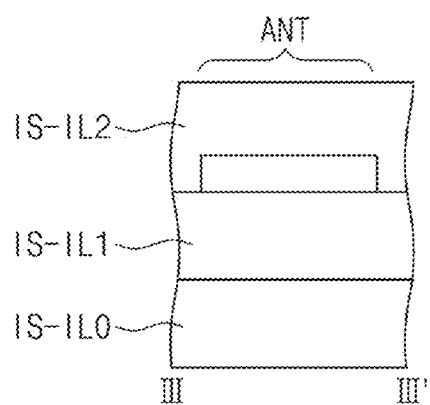
FIG. 7 is a cross-sectional view taken along line III-III' of FIG. 5 according to an embodiment of the invention.
Figure 7:
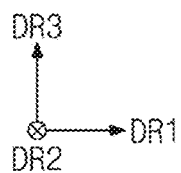

FIG. 7 is a cross-sectional view taken along line III-III' of FIG. 5 according to an embodiment of the invention.

Referring to FIGS. 5 and 7, the plurality of antenna patterns ANT may be disposed in or directly on a same layer as some of the plurality of sensing electrodes TE1 and TE2. The plurality of antenna patterns ANT may be disposed on the first insulating layer IS-IL1. In one embodiment, for example, the plurality of antenna patterns ANT may be disposed in or directly on a same layer as the plurality of sensing patterns SP1, the plurality of first portions SP2, the plurality of second portions BP2. However, this is merely an example, and the connection relationship between the plurality of connection patterns ANT according to an embodiment of the invention is not limited thereto. In one alternative embodiment, for example, the plurality of antenna patterns ANT may be disposed in or directly on a same layer as the plurality of bridge patterns BP1.

Each of the plurality of antenna patterns ANT may include a same material as each of the plurality of sensing electrodes TEL and TE2. However, this is merely an example, and the plurality of antenna patterns ANT according to an embodiment of the invention may include various materials. In one embodiment, for example, each of the plurality of antenna patterns ANT may include a carbon nanotube, a metal and/or a metal alloy, or a composite material thereof and may have a single-layered structure or a multilayered structure, in which titanium (Ti), aluminum (Al), and titanium (Ti) are sequentially laminated one on another. In such an embodiment, the metal may be silver (Ag), copper (Cu), aluminum (Al), gold (Au), or platinum (Pt), for example, but is not limited thereto.

Figure 8:
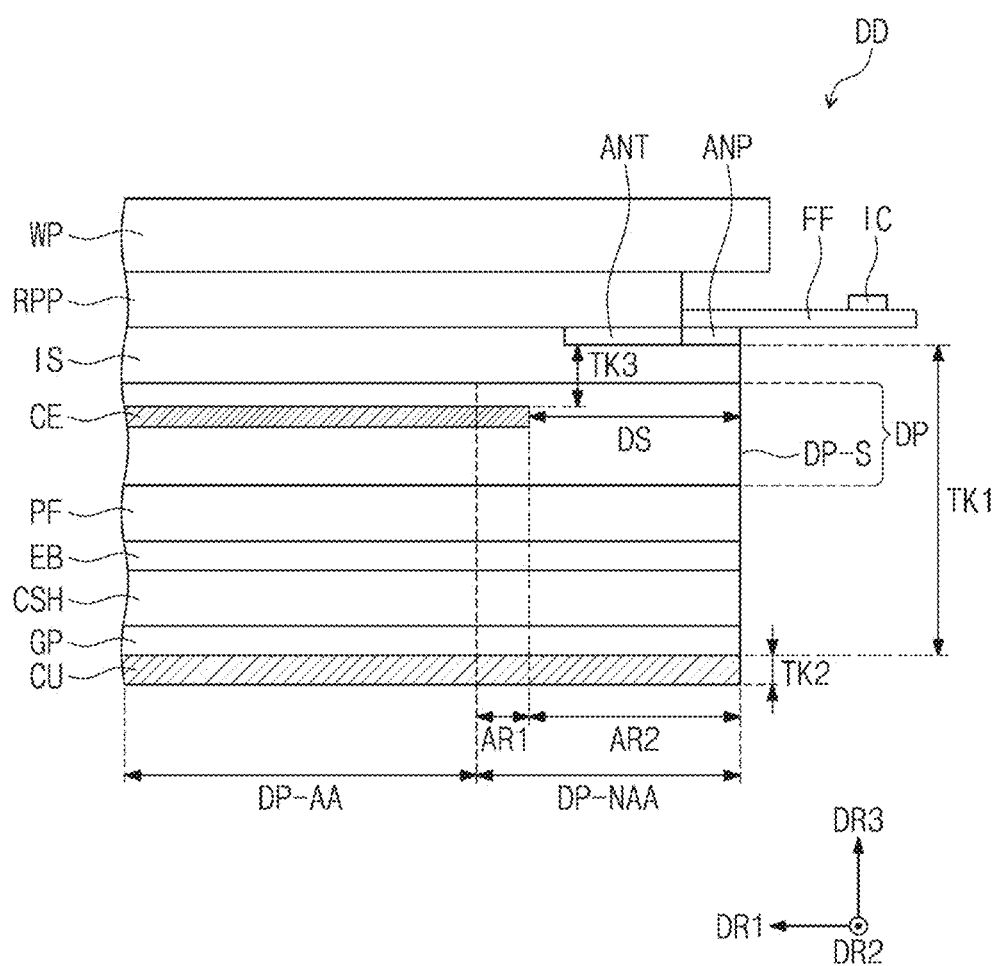
FIG. 8 is a cross-sectional view of an electronic device according to an embodiment of the invention.

FIG. 8 is a cross-sectional view of an electronic device according to an embodiment of the invention. In FIG. 8, the same or like reference numerals are used to indicate the same or like components as those described above with reference to FIG. 2, and any repetitive detailed descriptions thereof will be omitted or simplified.

Referring to FIG. 8, an embodiment of an electronic device DD may include a window WP, an anti-reflection layer RPP, a sensor layer IS, a flexible circuit board FF, a driving chip IC, a display layer DP, a protective layer PF, an emboss layer EB, a cushion layer CSH, a heat dissipation sheet GP, and a cover layer CU.

The sensor layer IS may include an antenna pattern ANT and an antenna pad ANP connected to one side of the antenna pattern ANT.

The flexible circuit board FF may be electrically connected to the antenna pad ANP. The flexible circuit board FF may have a ground coplanar wave guide ("GCW") structure. The flexible circuit board FF may be bent and disposed on a bottom surface of the cover layer CU.

The flexible circuit board FF and the antenna pad ANP may be bonded to each other through an adhesive member.

An adhesive member may be disposed between the flexible circuit board FF and the antenna pad ANP. In an embodiment, the adhesive member may include an anisotropic conductive film ("ACF"), for example. However, this is merely an example, and the adhesive member according to an embodiment of the invention may include various materials for bonding the flexible circuit board FF to the antenna pad ANP. In one alternative embodiment, for example, the adhesive member may include a pressure sensitive adhesive film ("PSA"), an optically clear adhesive film ("OCA"), or an optically clear adhesive resin ("OCR").

A driving chip IC may be disposed or mounted on the flexible circuit board FF. The flexible circuit board FF may transmit a signal generated by the driving chip IC to the antenna pattern ANT.

The driving chip IC may provide a signal to the antenna pattern ANT through the GCW structure. The driving chip IC may control an operation of the antenna pattern ANT. In one embodiment, for example, the driving chip IC may control beam steering of the plurality of antennas ANT by adjusting power supplied to each of the plurality of antenna patterns ANT and may improve energy by focusing a frequency signal in a specific direction. In such an embodiment, since a desired radiation pattern may be formed to improve radiation efficiency. In such an embodiment, the driving chip IC may be referred to as a beam forming chip. The driving chip IC may transmit a signal to the antenna pad ANP through the flexible circuit board FF. The signal may be supplied to the antenna pattern ANT by the flexible circuit board FF and the antenna pad ANP.

The display layer DP may be disposed below the sensor layer IS. An active area DP-AA and a peripheral area DP-NAA may be defined in the display layer DP. The peripheral area DP-NAA may include a first area AR1 and a second area AR2.

The display layer DP may include a common electrode CE. The common electrode CE may be the same as the second electrode CE illustrated in FIG. 4. The common electrode CE may have conductivity. The common electrode CE may be disposed on the active area DP-AA and the first area AR1. When viewed in the plan view in the third direction DR3, the common electrode CE may not overlap the second area AR2. The common electrode CE may be spaced by a first distance DS from a side surface DP-S of the display layer DP. The first distance DS may be about 300 micrometers (mm) or greater.

If the common electrode CE is disposed to extend up to the side surface DP-S of the display layer DP, when cutting the display layer DP by using a laser during the process of manufacturing the display layer DP, reliability of the laser cutting may be deteriorated by the metal of the common electrode CE. However, according to an embodiment of the invention, the common electrode CE may be spaced by a first distance DS from the side surface DP-S of the display layer DP in the first direction DR1 or the second direction DR2. Thus, manufacturing reliability of the display layer DP may be improved.

When viewed in the plan view in the third direction DR3, the antenna pattern ANT may not overlap the common electrode CE.

The protective layer PF, the emboss layer EB, the cushion layer CSH, and the heat dissipation sheet GP may be disposed below the display layer DP. Each of the protective layer PF, the emboss layer EB, the cushion layer CSH, and the heat dissipation sheet GP may include an insulating material. The protective layer PF, the emboss layer EB, the cushion layer CSH, the heat dissipation sheet GP, and layers of the display panel DP and the sensor layer IS, which are disposed between the antenna pattern ANT and the cover layer CU, may collectively have a first thickness TK1 in the third direction DR3. The first thickness TK1 may be about 370 mm or greater.

The cover layer CU may be disposed below the protective layer PF, the emboss layer EB, the cushion layer CSH, and the heat dissipation sheet GP. The cover layer CU may have conductivity. In one embodiment, for example, the cover layer CU may include copper (Cu). The cover layer CU may operate as a ground electrode for the antenna ANT. When viewed in the plan view in the third direction DR3, the cover layer CU may overlap the active area DP-AA, the first area AR1, and the second area AR2. When viewed in the plan view in the third direction DR3, the antenna pattern ANT may overlap the cover layer CU.

A ground voltage may be provided to the cover layer CU. However, this is merely an example, and driving for the operation of the cover layer CU as the ground electrode according to an embodiment is not limited thereto. In one alternative embodiment, for example, the cover layer CU may be electrically floated. The cover layer CU may have a second thickness TK2 in the third direction DR3. The second thickness TK2 may be about 18 mm or greater.

If the common electrode CE is disposed to extend up to the side surface DP-S of the display layer DP, the common electrode CE may operate as a ground electrode for the antenna pattern ANT. The insulating layer disposed between the antenna pattern ANT and the common electrode CE may operate as an antenna substrate having a third thickness TK3 for the operation of the antenna pattern ANT. The third thickness TK3 may be about 10 mm or less. In this case, the thickness of the antenna substrate for the operation of the antenna pattern ANT may not be secured. Thus, a bandwidth capable of radiating a frequency signal of the antenna pattern ANT may be limited. Also, a space for a design of the antenna may be secured only as much as the third thickness TK3. However, according to the embodiment of the invention, the antenna pattern ANT may not overlap the common electrode CE. When viewed in the plan view in the third direction DR3, the cover layer CU may overlap the antenna pattern ANT and the antenna pad ANP. The cover layer CU may operate as a ground electrode for the antenna pattern ANT. The protective layer PF, the emboss layer EB, the cushion layer CSH, and the heat dissipation sheet GP, along with the layers of the display panel DP and the sensor layer IS, which are disposed between the antenna pattern ANT and the cover layer CU, may operate as the antenna substrate having the first thickness TK1 for the operation of the antenna pattern ANT. Accordingly, in such an embodiment, a bandwidth capable of radiating a frequency of the antenna pattern ANT may increase. Thus, the electronic device DD may have improved frequency signal radiation performance. In such an embodiment, a space for the design of the antenna may be secured by the first thickness TK1 greater than the third thickness TK3.

Figure 9:
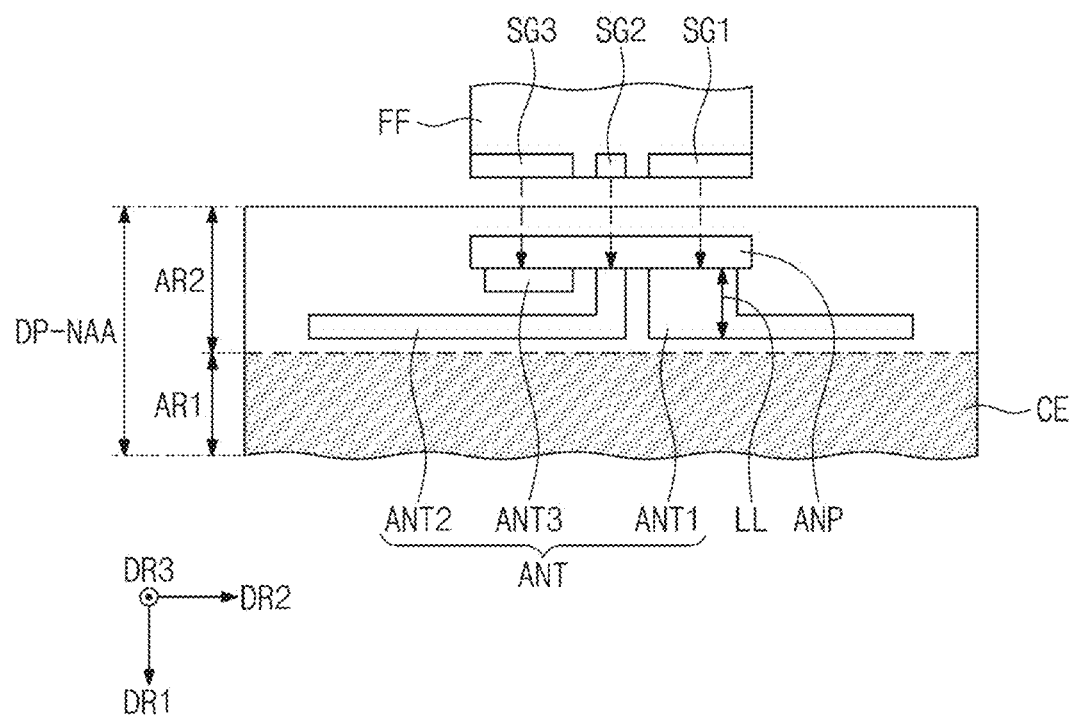
FIG. 9 is a plan view illustrating a portion of an electronic device according to an embodiment of the invention.

FIG. 9 is a plan view illustrating a portion of the electronic device according to an embodiment of the invention.

Referring to FIG. 9, in an embodiment, the antenna pattern ANT may include a dipole antenna. When viewed in the plan view in the third direction DR3, the antenna pattern ANT may overlap the second area AR2. The common electrode CE may overlap the first area AR1. The antenna pattern ANT and the common electrode CE may not overlap each other in the third direction DR3.

The antenna pattern ANT may include a first antenna ANT1, a second antenna ANT2, and a third antenna ANT3.

The flexible circuit board FF may include a first terminal SG1, a second terminal SG2, and a third terminal SG3.

The first antenna ANT1 may constitute a portion of the dipole antenna. The first antenna ANT1 may be electrically connected to the first terminal SG1 through an antenna pad ANP. The first antenna ANT1 may receive a ground signal through the first terminal SG1. Characteristics of the frequency signal may be adjusted by a length LL of a portion of the first antenna ANT1 extending from the antenna pad ANP in the first direction DR1.

The second antenna ANT2 may constitute the rest of the dipole antenna. The second antenna ANT2 may be electrically connected to the second terminal SG2 through the antenna pad ANP. The second antenna ANT2 may receive an antenna signal through the second terminal SG2. A length of a portion of the second antenna ANT2 extending from the antenna pad ANP in the first direction DR1 may be the same as the length LL of the portion of the first antenna ANT1 extending from the antenna pad ANP in the first direction DR1.

The third antenna ANT3 may not be configured to substantially serve as an antenna. The third antenna ANT3 may be electrically connected to the third terminal SG3 through the antenna pad ANP. The third antenna ANT3 may receive a ground signal through the third terminal SG3. That is, the flexible circuit board FF may transmit a signal to the antenna pattern ANT through a GCW structure.

Figure 10:
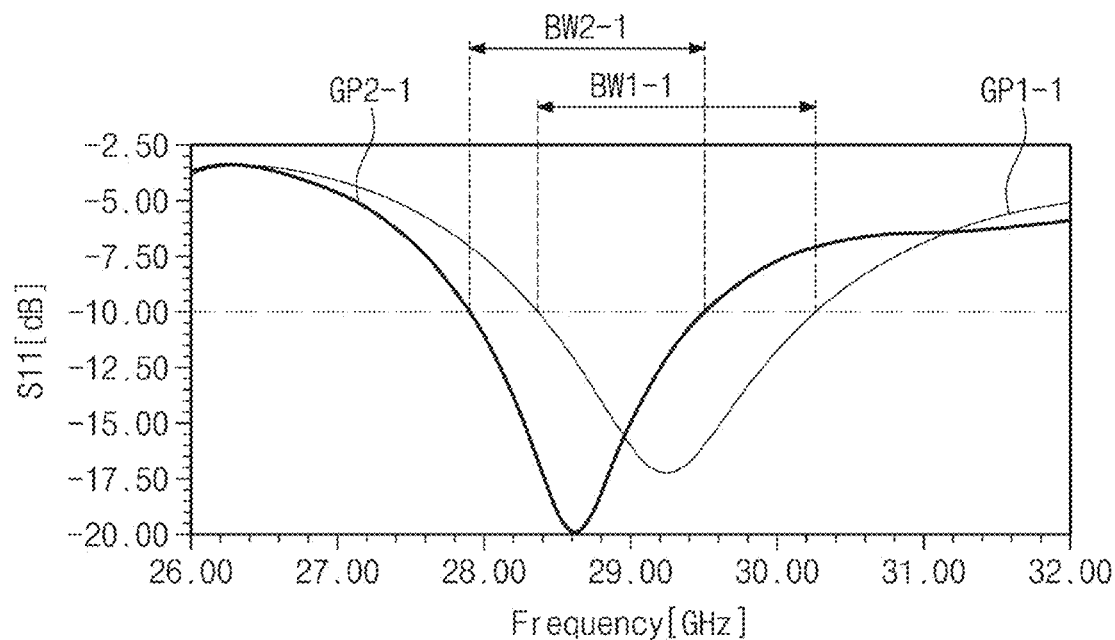
FIG. 10 is a graph illustrating an S-parameter depending on a frequency of an antenna according to an embodiment of the invention.

FIG. 10 is a graph illustrating an S-parameter depending on a frequency of an antenna according to an embodiment of the invention.

Referring to FIGS. 9 and 10, a value S11 may be one of the S-parameter. The value S11 may be a value representing a magnitude of an input signal, which is reflected to return, with respect to a magnitude of the input signal as a ratio. Here, the value S11 may be a reflection coefficient of the antenna pattern ANT, for example. When determining the operation of the antenna pattern ANT, it may be determined based on a case in which the value S11 is about-10 decibel (dB). The magnitude of about-10 dB may be a case in which a magnitude of the signal returning due to reflection of an input signal is about 10% of a magnitude of the input signal. When the value S11 is less than about-10 dB, it may be determined that the antenna pattern ANT operates in a corresponding frequency band and transmits, receives, or transmits/receives a signal including the corresponding frequency band.

A first graph GP1-1 may be an S-parameter of the antenna pattern ANT, in which the portion of the first antenna ANT1 extending from the antenna pad ANP has a length LL of about 0.5 mm in the first direction DR1. In the first graph GP1-1, the antenna pattern ANT may radiate a first signal. The first signal may include a first frequency band BW1-1 including a first resonant frequency. In the first graph GP1-1, a frequency range in which the antenna pattern ANT operates may be about 28.37 GHz to about 30.25 GHZ, and the first frequency band BW1-1 may be about 1.88 GHz.

A second graph GP2-1 may be an S-parameter of the antenna pattern ANT, which the portion of the first antenna ANT1 extending from the antenna pad ANP has a length LL of about 0.7 mm in the first direction DR1. In the second graph GP2-1, the antenna pattern ANT may radiate a second signal. The second signal may include a second frequency band BW2-1 including a second resonant frequency. In the second graph GP2-1, a frequency range in which the antenna pattern ANT operates may be about 27.90 GHz to about 29.50 GHz, and the second frequency band BW2-1 may be about 1.6 GHz.

Figure 11:
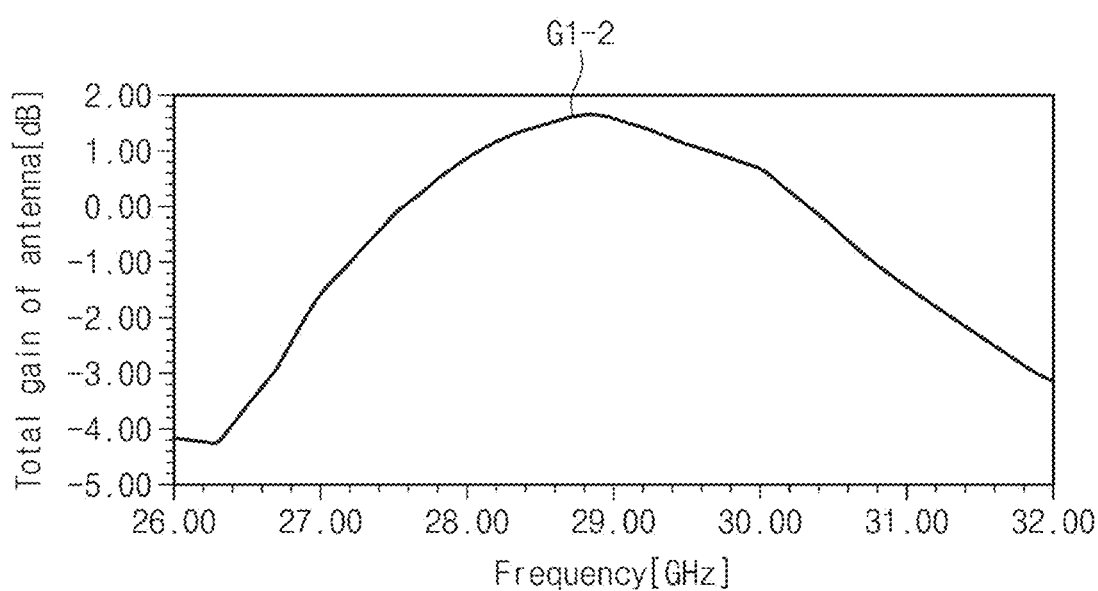
FIG. 11 is a graph illustrating a total gain depending on a frequency of an antenna pattern according to an embodiment of the invention.

FIG. 11 is a graph illustrating a total gain depending on a frequency of the antenna pattern according to an embodiment of the invention.

Referring to FIGS. 9 and 11, the antenna pattern ANT may be electrically connected to the driving chip IC (see FIG. 8) through the flexible circuit board FF. The antenna pattern ANT may receive power from the driving chip IC (see FIG. 8) to operate at a specific frequency. In one embodiment, for example, referring to a graph G1-2, the specific frequency may be about 29 GHZ, and a total antenna gain of about 1.61 dB may be maintained at a frequency of about 29 GHz. The specific frequency may also be referred to as an operating frequency.

Figure 12:
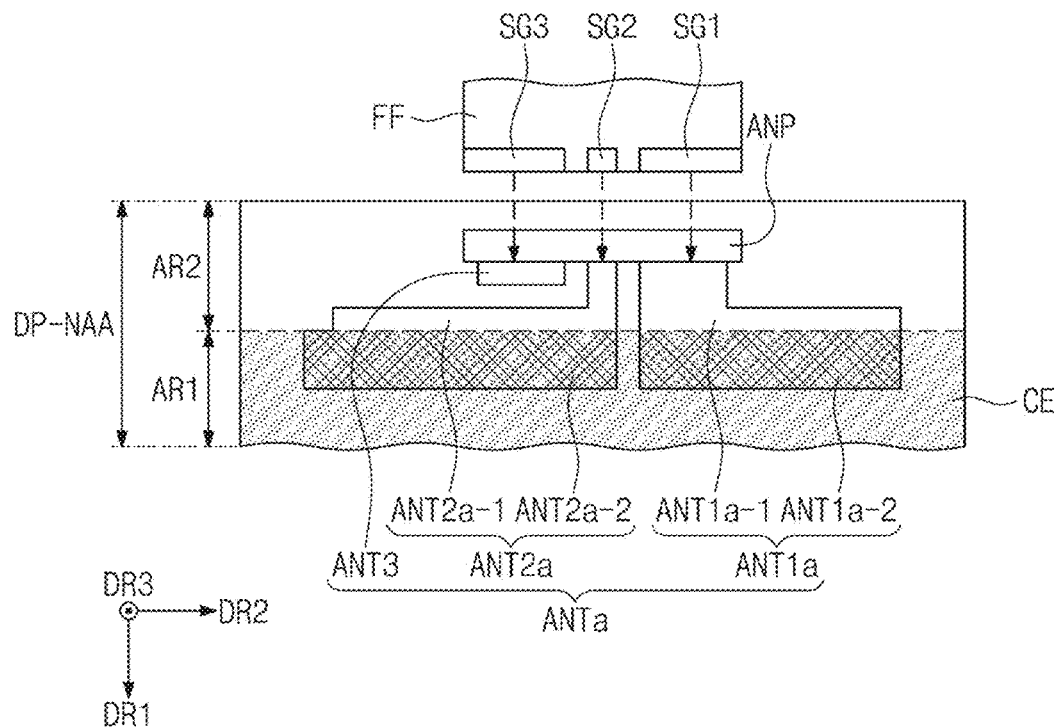
FIGS. 12 to 21 are plan views illustrating a portion of an electronic device according to an embodiment of the invention.

FIG. 12 is a plan view illustrating a portion of the electronic device according to an embodiment of the invention. In FIG. 12, the same or like reference numerals are used to indicate the same or like components as those described above with reference to FIG. 9, and any repetitive detailed descriptions thereof will be omitted or simplified.

Referring to FIG. 12, the antenna pattern ANTA may include a dipole antenna. The antenna pattern ANTa may include a first antenna ANT1a, a second antenna ANT2a, and a third antenna ANT3.

The first antenna ANT1a may constitute a portion of the dipole antenna. The first antenna ANT1a may be electrically connected to the first terminal SG1 through the antenna pad ANP. The first antenna ANT1a may receive a ground signal through the first terminal SG1.

The first antenna ANT1a may include a first portion ANT1a-1 and a second portion ANT1a-2. When viewed in the plan view in the third direction DR3, the first portion ANT1a-1 may overlap the second area AR2. The second portion ANT1a-2 may be disposed adjacent to the first portion ANT1a-1. The second portion ANT1a-2 may have a mesh structure. When viewed in the plan view in the third direction DR3, the second portion ANT1a-2 may overlap the first area AR1. The second portion ANT1a-2 may overlap the common electrode CE in the third direction DR3.

The second antenna ANT2a may constitute the rest of the dipole antenna. The second antenna ANT2a may be electrically connected to the second terminal SG2 through the antenna pad ANP. The second antenna ANT2a may receive an antenna signal through the second terminal SG2.

The second antenna ANT2a may include a first portion ANT2a-1 and a second portion ANT2a-2. When viewed in the plan view in the third direction DR3, the first portion ANT2a-1 may overlap the second area AR2. The second portion ANT2a-2 may be disposed adjacent to the first portion ANT2a-1. The second portion ANT2a-2 may have a mesh structure. When viewed in the plan view in the third direction DR3, the second portion ANT2a-2 may overlap the first area AR1. The second portion ANT2a-2 may overlap the common electrode CE in the third direction DR3.

Figure 13:
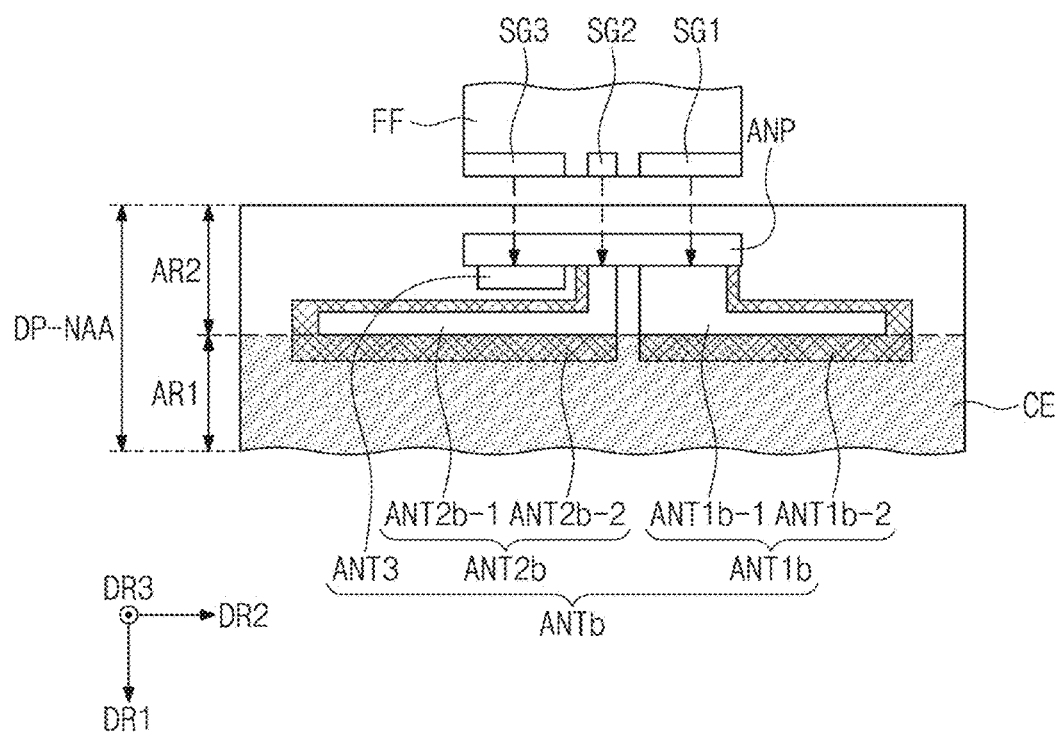

FIG. 13 is a plan view of an electronic device according to an embodiment of the invention. In FIG. 13, the same or like reference numerals are used to indicate the same or like components described as those above with reference to FIG. 9, and any repetitive detailed descriptions thereof will be omitted or simplified.

Referring to FIG. 13, an antenna pattern ANTb may include a dipole antenna. The antenna pattern ANTb may include a first antenna ANT1b, a second antenna ANT2b, and a third antenna ANT3.

The first antenna ANT1b may constitute a portion of the dipole antenna. The first antenna ANT1b may be electrically connected to the first terminal SG1 through the antenna pad ANP. The first antenna ANT1b may receive a ground signal through the first terminal SG1.

The first antenna ANT1b may include a first portion ANT1b-1 and a second portion ANT1b-2. When viewed in the plan view in the third direction DR3, the first portion ANT1b-1 may overlap the second area AR2. The second portion ANT1b-2 may surround the first portion ANT1b-1. The second portion ANT1b-2 may have a mesh structure. When viewed in the plan view in the third direction DR3, the second portion ANT1b-2 may overlap the first area AR1 and the second area AR2.

The second antenna ANT2b may constitute the rest of the dipole antenna. The second antenna ANT2b may be electrically connected to the second terminal SG2 through the antenna pad ANP. The second antenna ANT2b may receive an antenna signal through the second terminal SG2.

The second antenna ANT2b may include a first portion ANT2b-1 and a second portion ANT2b-2. When viewed in the plan view in the third direction DR3, the first portion ANT2b-1 may overlap the second area AR2. The second portion ANT2b-2 may surround the first portion ANT2b-1. The second portion ANT2b-2 may have a mesh structure. When viewed in the plan view in the third direction DR3, the second portion ANT2b-2 may overlap the first area AR1 and the second area AR2.

Figure 14:
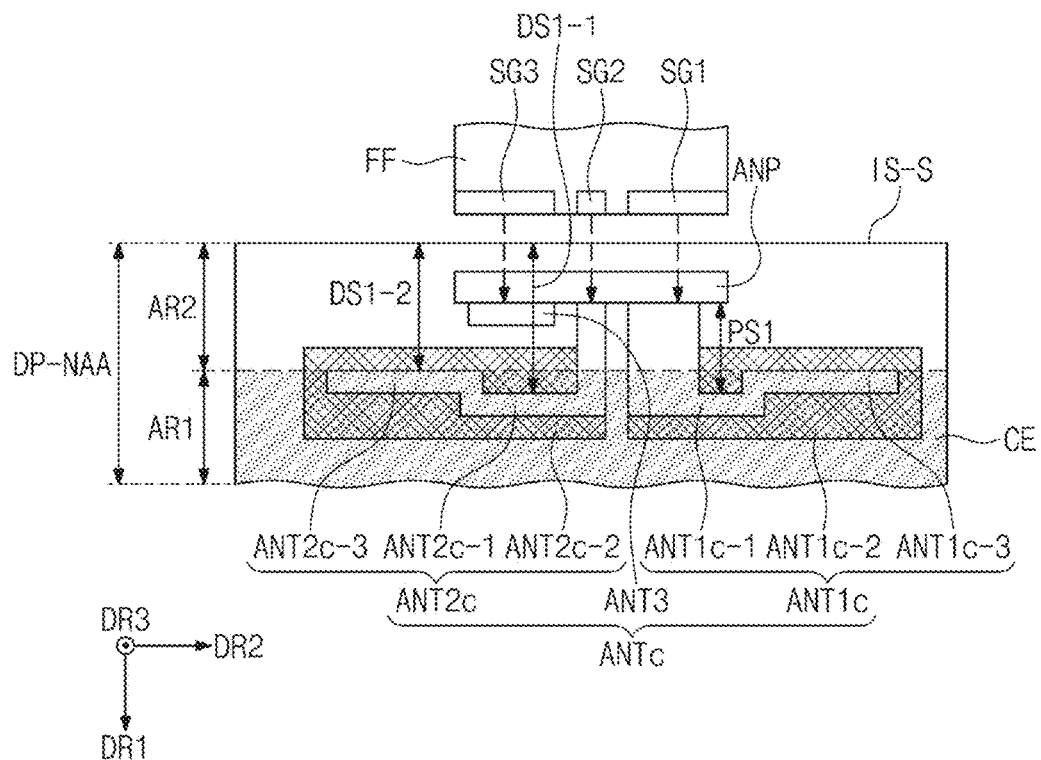

FIG. 14 is a plan view illustrating a portion of the electronic device according to an embodiment of the invention. In describing FIG. 14, the same or like reference numerals are used to indicate the same or like components as those described above with reference to FIG. 9, and any repetitive detailed descriptions thereof will be omitted or simplified.

Referring to FIG. 14, an antenna pattern ANTc may include a bending dipole. The antenna pattern ANTc may include a first antenna ANT1c, a second antenna ANT2c, and a third antenna ANT3.

The first antenna ANT1c may constitute a portion of the bending dipole antenna. The first antenna ANT1c may be electrically connected to the first terminal SG1 through the antenna pad ANP. The first antenna ANT1c may receive a ground signal through the first terminal SG1.

The first antenna ANT1c may include a first portion ANT1c-1, a second portion ANT1c-2, and a third portion ANT1c-3. When viewed in the plan view in the third direction DR3, the first portion ANT1c-1 may overlap the first area AR1. The third portion ANT1c-3 may protrude from the first portion ANT1c-1 in the first direction DR1 to extend in the second direction DR2. When viewed in the plan view in the third direction DR3, the third portion ANT1c-3 may overlap the first area AR1. The second portion ANT1c-2 may surround the first portion ANT1c-1 and the third portion ANT1c-3. The second portion ANT1c-2 may have a mesh structure. When viewed in the plan view in the third direction DR3, the second portion ANT1c-2 may overlap the first area AR1 and the second area AR2.

The second antenna ANT2c may constitute the rest of the bending dipole antenna. The second antenna ANT2c may be electrically connected to the second terminal SG2 through the antenna pad ANP. The second antenna ANT2c may receive an antenna signal through the second terminal SG2.

The second antenna ANT2c may include a first portion ANT2c-1, a second portion ANT2c-2, and a third portion ANT2c-3. When viewed in the plan view in the third direction DR3, the first portion ANT2c-1 may overlap the first area AR1. The third portion ANT1c-3 may protrude from the first portion ANT1c-1 in the first direction DR1 to extend in the second direction DR2. When viewed in the plan view in the third direction DR3, the third portion ANT2c-3 may overlap the first area AR1. When viewed in the plan view in the third direction DR3, a first distance DS1-1 by which the first portion ANT2c-1 is spaced apart from a side surface IS-S of the sensor layer IS (see FIG. 8) in the first direction DR1 may be greater than a second distance DS1-2 by which the third portion ANT2c-3 is spaced apart from the side surface IS-S of the sensor layer IS (see FIG. 8) in the first direction DR1. The second portion ANT2c-2 may surround the first portion ANT2c-1 and the third portion ANT2c-3. The second portion ANT2c-2 may have a mesh structure. When viewed in the plan view in the third direction DR3, the second portion ANT2c-2 may overlap the first area AR1 and the second area AR2.

According to an embodiment of the invention, when viewed in the plan view in the third direction DR3, the first portions ANT1c-1 and ANT2c-1, each of which has a bending dipole structure, may be spaced by a first distance PS1 from the antenna pad ANP in the first direction DR1. A distance at which the antenna pad ANP and the flexible circuit board FF are bonded to each other may be secured. Thus, the electronic device DD (see FIG. 8) may have improved reliability.

Figure 15:
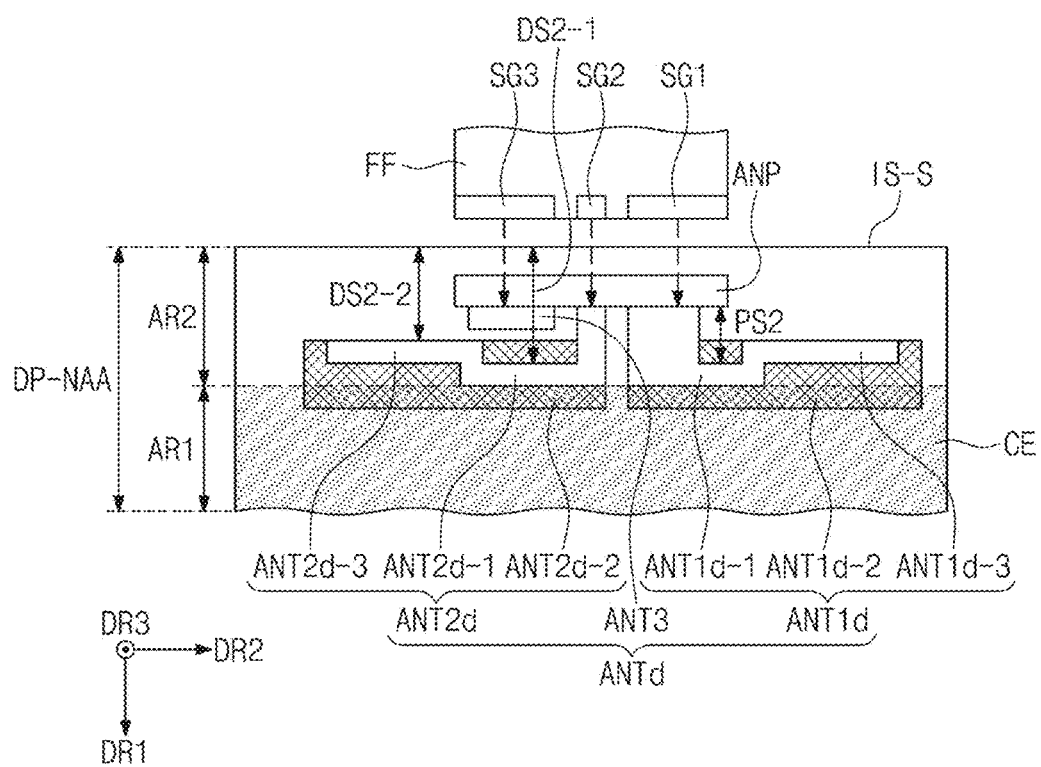

FIG. 15 is a plan view illustrating a portion of the electronic device according to an embodiment of the invention. In FIG. 15, the same or like reference numerals are used to indicate the same or like components as those described above with reference to FIG. 9, and any repetitive detailed descriptions thereof will be omitted or simplified.

Referring to FIG. 15, the antenna pattern ANTd may include a bending dipole. The antenna pattern ANTd may include a first antenna ANT1d, a second antenna ANT2d, and a third antenna ANT3.

The first antenna ANT1d may constitute a portion of the bending dipole antenna. The first antenna ANTd may be electrically connected to the first terminal SG1 through the antenna pad ANP. The first antenna ANT1d may receive a ground signal through the first terminal SG1.

The first antenna ANT1d may include a first portion ANT1d-1, a second portion ANT1d-2, and a third portion ANT1d-3. When viewed in the plan view in the third direction DR3, the first portion ANTd-1 may overlap the second area AR2. The third portion ANT1d-3 may protrude from the first portion ANT1c-1 in the first direction DR1 to extend in the second direction DR2. When viewed in the plan view in the third direction DR3, the third portion ANT1d-3 may overlap the second area AR2. The second portion ANT1d-2 may surround the first portion ANT1d-1 and the second portion ANT1d-2. The second portion ANT1d-2 may have a mesh structure. When viewed in the plan view in the third direction DR3, the second portion ANTd-2 may overlap the first area AR1 and the second area AR2.

The second antenna ANT2d may constitute the rest of the bending dipole antenna. The second antenna ANT2d may be electrically connected to the second terminal SG2 through the antenna pad ANP. The second antenna ANT2d may receive an antenna signal through the second terminal SG2.

The second antenna ANT2d may include a first portion ANT2d-1, a second portion ANT2d-2, and a third portion ANT2d-3. When viewed in the plan view in the third direction DR3, the first portion ANT2d-1 may overlap the second area AR2. The third portion ANT2d-3 may protrude from the first portion ANT2d-1 in the first direction DR1 to extend in the second direction DR2. When viewed in the plan view in the third direction DR3, the third portion ANT2d-3 may overlap the second area AR2. When viewed in the plan view in the third direction DR3, a first distance DS2-1 by which the first portion ANT2d-1 is spaced apart from a side surface IS-S of the sensor layer IS (see FIG. 8) in the first direction DR1 may be greater than a second distance DS2-2 by which the third portion ANT2d-3 is spaced apart from the side surface IS-S of the sensor layer IS (see FIG. 8) in the first direction DR1. The second portion ANT2d-2 may surround the first portion ANT2d-1 and the third portion ANT2d-3. The second portion ANT2d-2 may have a mesh structure. When viewed in the plan view in the third direction DR3, the second portion ANT2d-2 may overlap the first area AR1 and the second area AR2.

According to an embodiment, when viewed in the plan view in the third direction DR3, the first portions ANT1d-1 and ANT2d-1, each of which has a bending dipole structure, may be spaced a second distance PS2 from the antenna pad ANP in the first direction DR1. A distance at which the antenna pad ANP and the flexible circuit board FF are bonded to each other may be secured. Thus, the electronic device DD (see FIG. 8) may have improved reliability.

Figure 16:
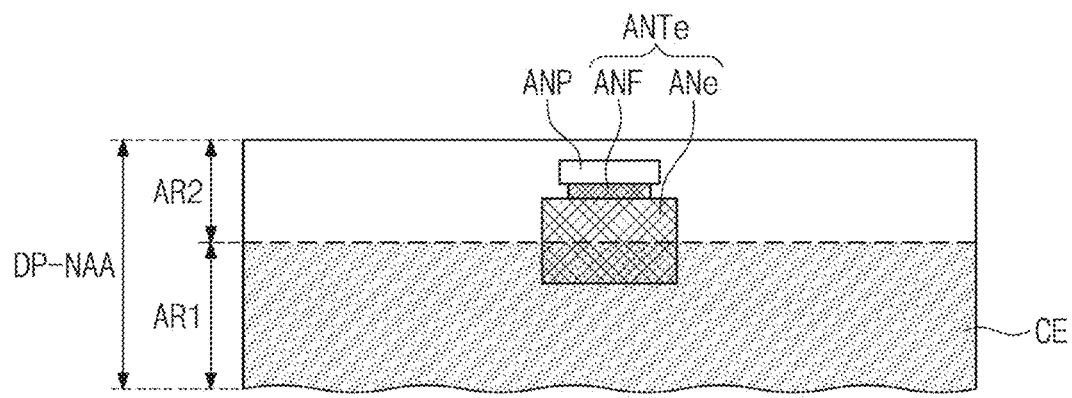
Figure 16:
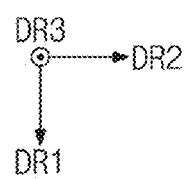

FIG. 16 is a plan view of an electronic device according to an embodiment of the invention.

Referring to FIG. 16, the antenna pattern ANTe may include a patch antenna. When viewed in the plan view in the third direction DR3, the antenna pattern ANTe may overlap the peripheral area DP-NAA.

The antenna pattern ANTe may include an antenna ANE and an antenna line ANF. When viewed in the plan view in the third direction DR3, at least a portion of the antenna ANE may overlap the first area AR1, and the rest of the antenna ANE may overlap the second area AR2. The rest of the antenna ANE may not overlap the common electrode CE in the third direction DR3. The antenna ANe may have a rectangular shape. However, this is merely an example. Thus, the shape of the antenna ANe according to an embodiment of the invention is not limited thereto. In one alternative embodiment, for example, the antenna ANe may have a circular shape. The antenna line ANF is electrically connected to the antenna pad ANP and the antenna ANE and may supply power to the antenna ANE.

Figure 17:
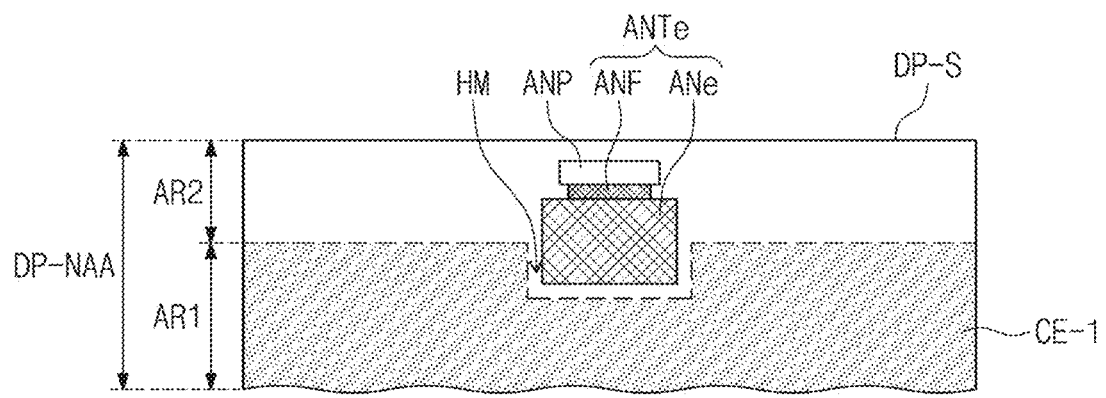
Figure 17:
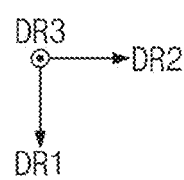

FIG. 17 is a plan view of an electronic device according to an embodiment of the invention. In FIG. 17, the same or like reference numerals are used to indicate the same or like components as those described above with reference to FIG. 16, and any repetitive detailed descriptions thereof will be omitted or simplified.

Referring to FIGS. 8 and 17, a groove HM may be defined in the common electrode CE-1 in the first direction DR1 from the side surface DP-S of the display layer DP. When viewed in the plan view in the third direction DR3, the antenna pattern ANTe may be disposed in the groove HM. The antenna pattern ANTe may not overlap the common electrode CE-1 in the third direction DR3.

According to an embodiment of the invention, the cover layer CU may cover the antenna pattern ANTe and the antenna pad ANP. The cover layer CU may operate as a ground electrode for the antenna pattern ANTe. The protective layer PF, the emboss layer EB, the cushion layer CSH, and the heat dissipation sheet GP, along with the layers of the display panel DP and the sensor layer IS, which are disposed between the antenna pattern ANTe and the cover layer CU, may operate as the antenna substrate having the first thickness TK1 for the operation of the antenna pattern ANTe. In such an embodiment, a bandwidth capable of radiating the frequency of the antenna pattern ANTe may be increased. Thus, the electronic device DD may have improved frequency signal radiation performance.

Figure 18:
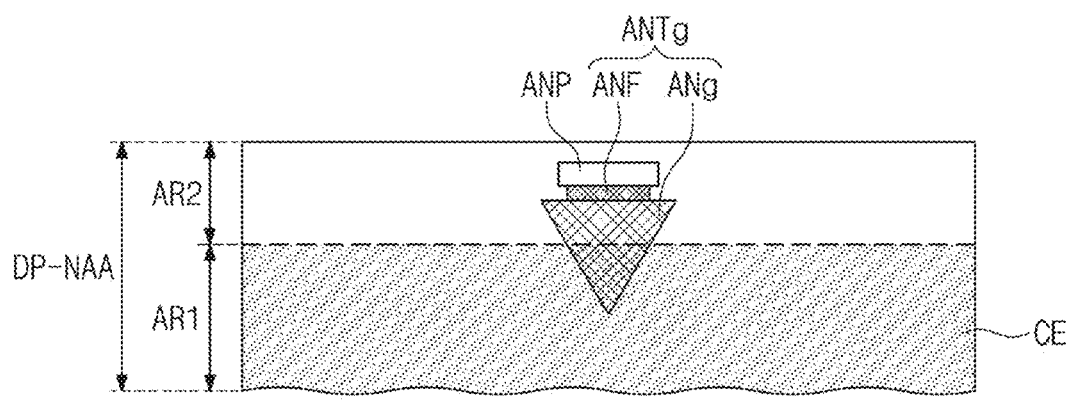
Figure 18:
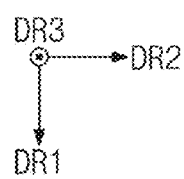

FIG. 18 is a plan view of an electronic device according to an embodiment of the invention.

Referring to FIG. 18, an antenna pattern ANTg may include a patch antenna. When viewed in the plan view in the third direction DR3, the antenna pattern ANTg may overlap the peripheral area DP-NAA.

The antenna pattern ANTg may include an antenna ANg and an antenna line ANF. When viewed in the plan view in the third direction DR3, at least a portion of the antenna Ang may overlap the first area AR1, and the rest of the antenna ANg may overlap the second area AR2. The rest of the antenna ANg may not overlap the common electrode CE. The antenna ANg may have a triangular shape.

Figure 19:
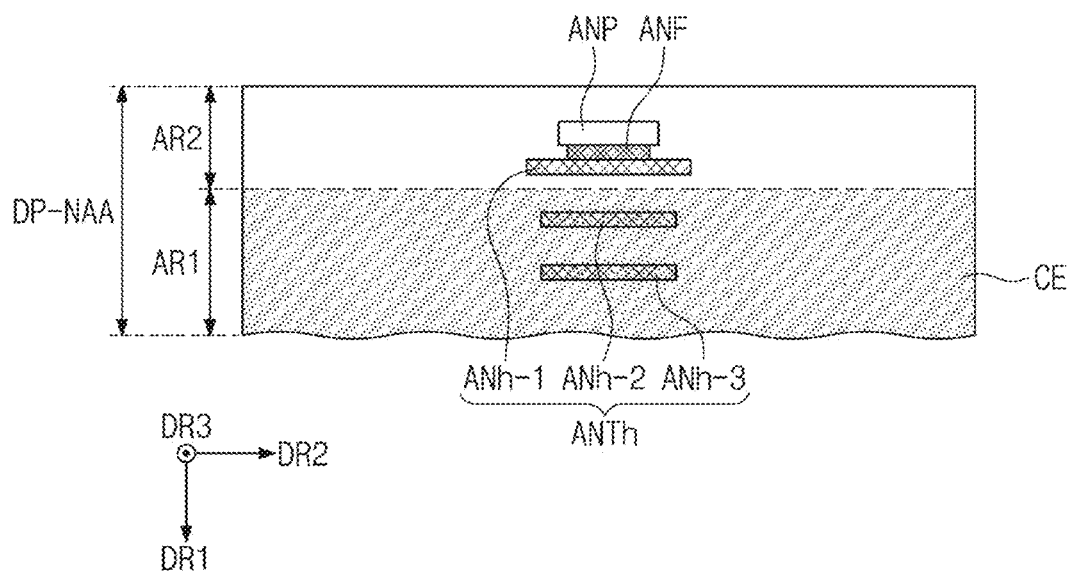
Figure 19:
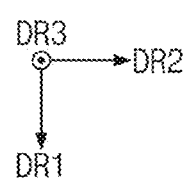

FIG. 19 is a plan view illustrating a portion of the electronic device according to an embodiment of the invention.

Referring to FIG. 19, an antenna pattern ANTh may include a Yagi-Uda antenna. When viewed in the plan view, the antenna pattern ANTh may overlap the peripheral area DP-NAA.

The antenna pattern ANTh may include a first antenna ANh-1, a second antenna ANh-2, and a third antenna ANh-3. The first antenna ANh-1 may be connected to the antenna line ANF. When viewed in the plan view in the third direction DR3, the first antenna ANh-1 may overlap the second area AR2. The second antenna ANh-2 may be spaced apart from the first antenna ANh-1 in the first direction DR1. When viewed in the plan view in the third direction DR3, the second antenna ANh-2 may overlap the first area AR1. The second antenna ANh-2 may overlap the common electrode CE. The third antenna ANh-3 may be spaced apart from the first antenna ANh-1 in the first direction DR1 with the second antenna ANh-2 therebetween. When viewed in the plan view in the third direction DR3, the third antenna ANh-3 may overlap the first area AR1. The third antenna ANh-3 may overlap the common electrode CE in the third direction DR3. Each of the second antenna ANh-2 and the third antenna ANh-3 in the second direction DR2 may have a width less than that of the first antenna ANh-1 in the second direction DR2.

Figure 20:
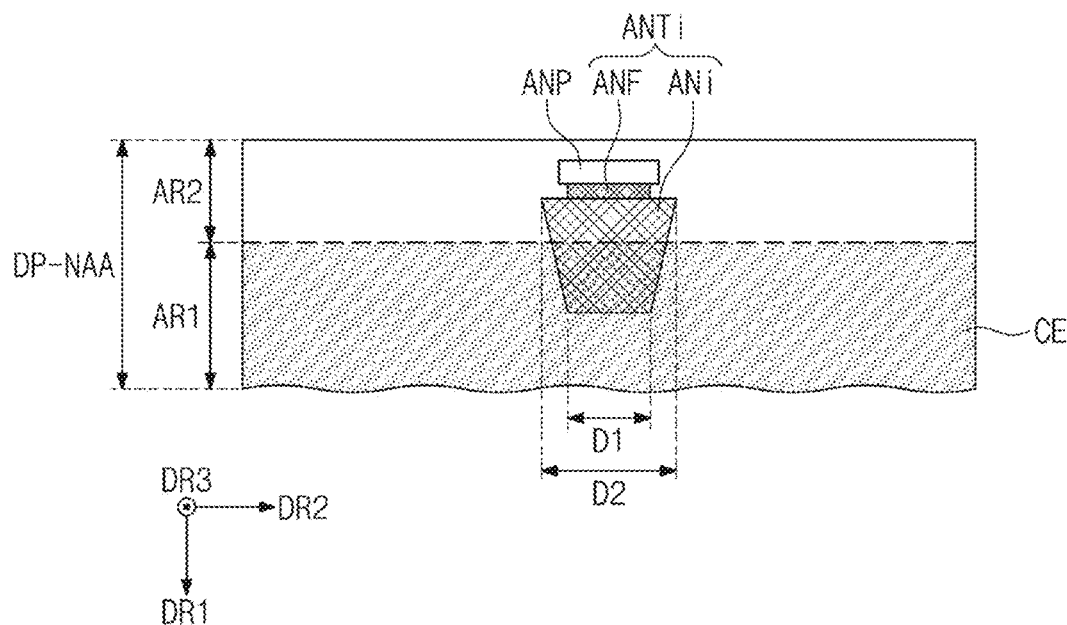

FIG. 20 is a plan view of an electronic device according to an embodiment of the invention.

Referring to FIG. 20, the antenna pattern ANTi may include a patch antenna. When viewed in the plan view in the third direction DR3, the antenna pattern ANTi may overlap the peripheral area DP-NAA.

The antenna pattern ANTi may include an antenna ANi and an antenna line ANF. When viewed in the plan view in the third direction DR3, at least a portion of the antenna ANi may overlap the first area AR1, and the rest of the antenna ANi may overlap the second area AR2. The rest of the antenna ANi may not overlap the common electrode CE in the third direction DR3. The antenna ANi may have a trapezoidal shape having a first side D1 extending from the first area AR1 in the second direction DR2 and a second side D2 extending from the second area AR2 in the second direction DR2.

Figure 21:
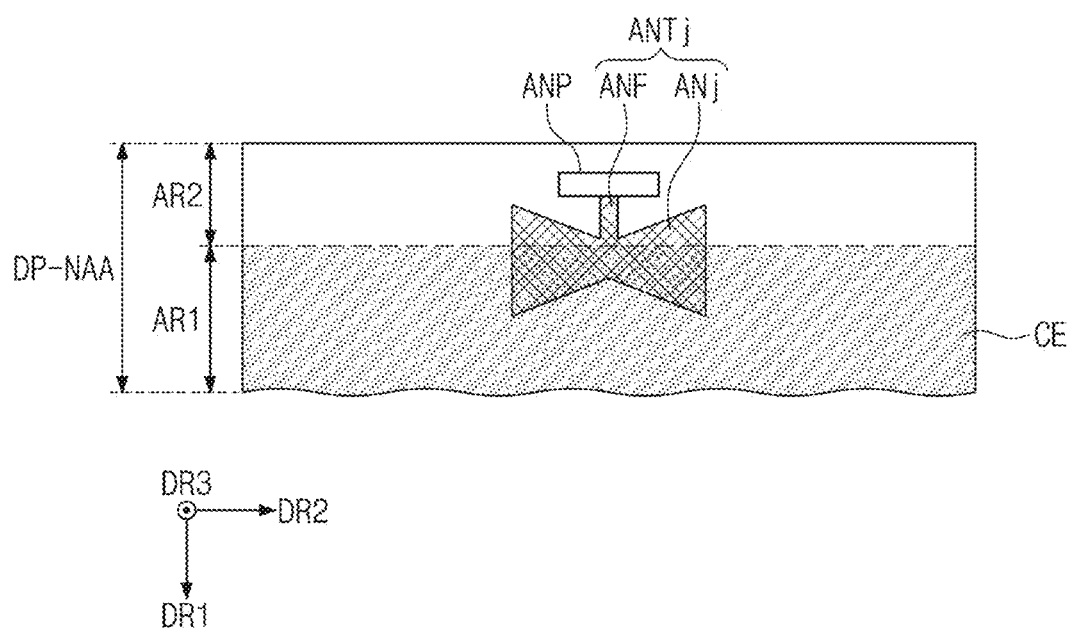

FIG. 21 is a plan view of an electronic device according to an embodiment of the invention.

Referring to FIG. 21, an antenna pattern ANTj may include a patch antenna. When viewed in the plan view in the third direction DR3, the antenna pattern ANTj may overlap the peripheral area DP-NAA.

The antenna pattern ANTj may include an antenna ANj and an antenna line ANF. When viewed in the plan view in the third direction DR3, at least a portion of the antenna ANj may overlap the first area AR1, and the rest of the antenna ANj may overlap the second area AR2. The rest of the antenna ANj may not overlap the common electrode CE in the third direction DR3. The antenna ANj may have a bow-tie shape.

Figure 22:
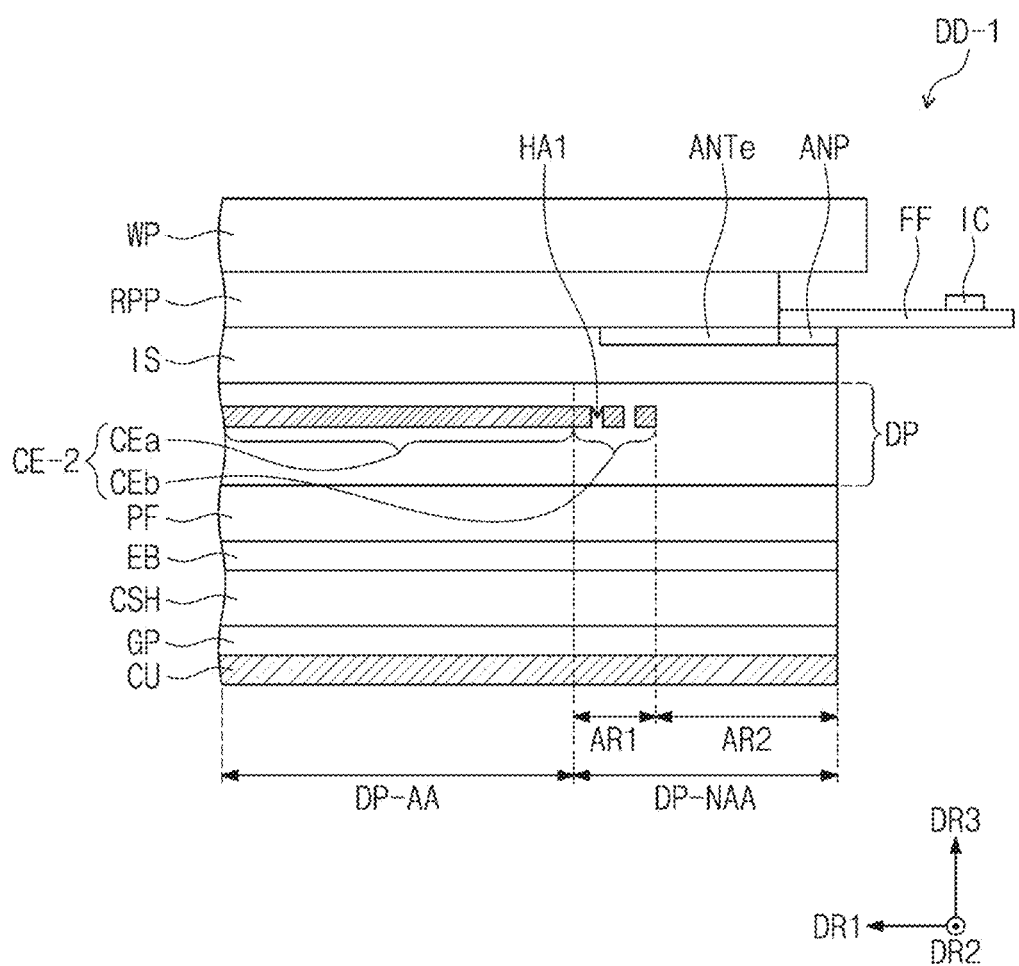
FIGS. 22 to 24 are cross-sectional views of the electronic device according to an embodiment of the invention.

FIG. 22 is a cross-sectional view of an electronic device according to an embodiment of the invention. In FIG. 22, the same or like reference numerals are used to indicate the same or like components as those described above with reference to FIGS. 8 and 16, and any repetitive detailed descriptions thereof will be omitted or simplified.

Referring to FIG. 22, in an embodiment of an electronic device DD-1, a common electrode CE-2 may include a first electrode portion CEa and a second electrode portion CEb. The first electrode portion CEa may overlap the active area DP-AA in the third direction DR3. The second electrode portion CEb may overlap the first area AR1 in the third direction DR3. A plurality of openings HA1 may be defined in the second electrode portion CEb.

When viewed in the plan view in the third direction DR3, the antenna pattern ANTe may overlap the first area AR1 and the second area AR12. The antenna pattern ANTe may overlap the cover layer CU in the third direction DR3. The antenna pattern ANTe illustrated in FIG. 22 may be the patch antenna pattern ANTe illustrated in FIG. 16, but the type of the antenna pattern according to an embodiment of the invention is not limited there. In one alternative embodiment, for example, the antenna pattern ANTe may have a dipole antenna shape.

A ratio of a surface area, in which the plurality of openings HA1 are defined, with respect to a surface area of the second electrode portion CEb may be about 25% or greater.

Table 1 is a table that shows results obtained by comparing a frequency range and a total gain according to the ratio of the surface area, in which the plurality of openings HA1 is defined, with respect to the surface area of the second electrode portion CEb according to an embodiment of the invention. The frequency range may also be referred to as a bandwidth of the antenna pattern ANTe. The ratio of the surface area, in which the plurality of openings HA1 are defined, with respect to the surface area of the second electrode portion CEb may be referred to as an aperture ratio.

TABLE 1

| Aperture ratio [%] | −10 dB Frequency range [GHz] | Total gain [dB] (Operating frequency [GHz]) |
|---|---|---|
| 10 | 25.82-26.09 | 2.6(25.94) |
| 15 | 25.77-26.27 | 2.6(25.94) |
| 20 | 25.83-26.36 | 2.6(25.94) |
| 25 | 25.83-26.40 | 3.3(26.16) |
| 50 | 25.99-26.63 | 3.3(26.3) |
| 75 | 26.18-26.82 | 3.3(26.44) |
| 90 | 26.13-26.76 | 3.3(26.44) |
| 100 | 26.22-26.77 | 3.42(26.5) |

Referring to Table 1, as the aperture ratio decreases, the total gain of the antenna pattern ANT may decrease. When the aperture ratio is about 100%, it may be the same state as that of the second area AR2 on which the common electrode CE-2 is not disposed. When the aperture ratio ranges of about 25% to about 100%, the frequency range of about-10 dB and the total gain may be similar to each other. That is, the aperture ratio of the second electrode portion CEb may be about 25% or greater.

According to an embodiment of the invention, when viewed in the plan view in the third direction DR3, the cover layer CU may overlap the antenna pattern ANTe and the antenna pad ANP. The cover layer CU may operate as a ground electrode for the antenna pattern ANTe. The protective layer PF, the emboss layer EB, the cushion layer CSH, and the heat dissipation sheet GP, along with the layers of the display panel DP and the sensor layer IS, which are disposed between the portion of the antenna pattern ANTe, which overlaps the second area AR2, and the cover layer CU may operate as an antenna substrate for the operation of the antenna pattern ANTe. In such an embodiment, a bandwidth capable of radiating the frequency of the antenna pattern ANTe may be increased. Thus, an electronic device DD-1 may have improved frequency signal radiation performance.

In such an embodiment of the invention, a portion of the antenna pattern ANTe that overlaps the first area AR1 may have a predetermined aperture ratio by the plurality of openings HA1 defined in the second electrode portion CEb, and the protective layer PF, the emboss layer EB, the cushion layer CSH, and the heat dissipation sheet GP, along with the layers of the display panel DP and the sensor layer IS, which are disposed between the portion of the antenna pattern ANTe that overlaps the first area AR1 and the cover layer CU may operate as the antenna substrate for the operation of the antenna pattern ANT. In such an embodiment, a bandwidth capable of radiating the frequency of the antenna pattern ANTe may be increased. Thus, an electronic device DD-1 may have improved frequency signal radiation performance.

Figure 23:
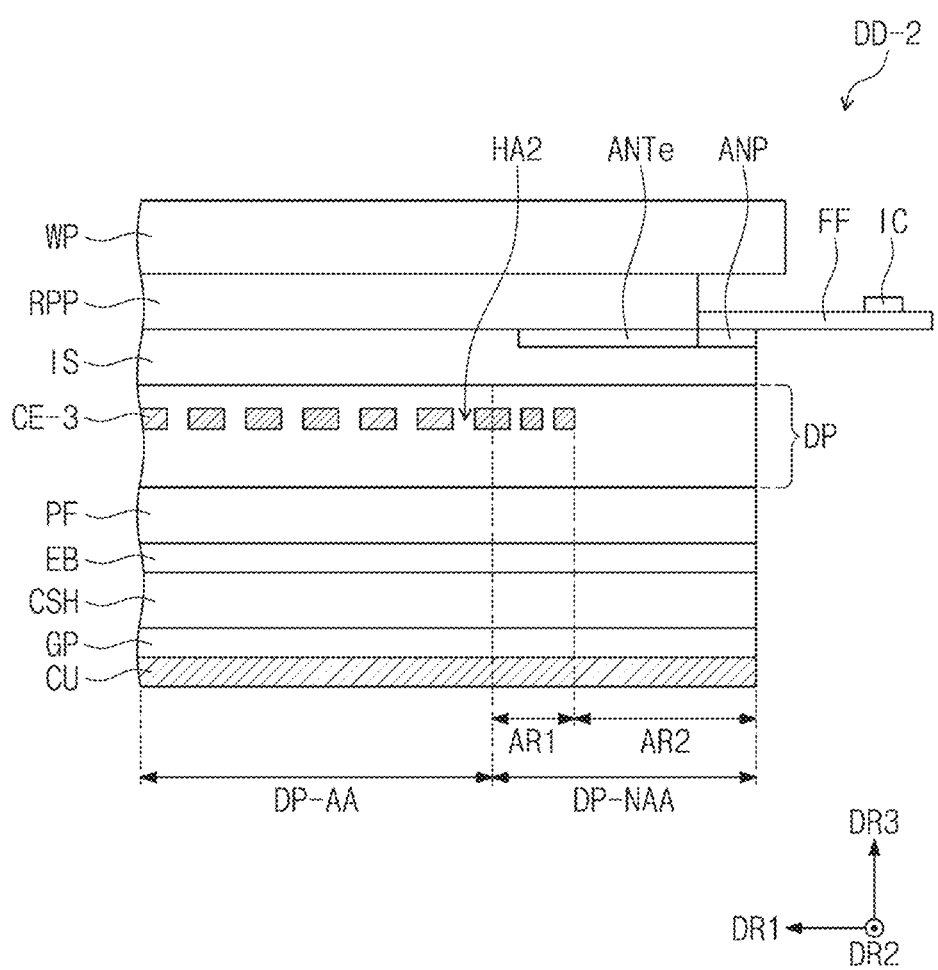

FIG. 23 is a cross-sectional view of an electronic device according to an embodiment of the invention. In FIG. 23, the same or like reference numerals are used to indicate the same or like components as those described above with reference to FIG. 22, and any repetitive detailed descriptions thereof will be omitted or simplified.

Referring to FIG. 23, in an embodiment of an electronic device DD-2, a plurality of openings HA2 may be defined in a common electrode CE-3. A ratio of a surface area, in which the plurality of openings HA2 are defined, with respect to a surface area of the common electrode CE-3 may be about 25% or greater.

According to an embodiment of the invention, when viewed in the plan view in the third direction DR3, the cover layer CU may overlap the antenna pattern ANTe and the antenna pad ANP. The cover layer CU may operate as a ground electrode for the antenna pattern ANTe. The protective layer PF, the emboss layer EB, the cushion layer CSH, and the heat dissipation sheet GP, along with the layers of the display panel DP and the sensor layer IS, which are disposed between the portion of the antenna pattern ANTe, which overlaps the second area AR2, and the cover layer CU may operate as an antenna substrate for the operation of the antenna pattern ANTe. In such an embodiment, a bandwidth capable of radiating the frequency of the antenna pattern ANTe may be increased. Thus, an electronic device DD-1 may have improved frequency signal radiation performance.

In such an embodiment of the invention, a portion of the antenna pattern ANTe that overlaps the first area AR1 may have a predetermined aperture ratio by the plurality of openings HA2 defined in the common electrode CE-3, and the protective layer PF, the emboss layer EB, the cushion layer CSH, and the heat dissipation sheet GP, along with the layers of the display panel DP and the sensor layer IS, which are disposed between the portion of the antenna pattern ANTe, that overlaps the first area AR1 and the cover layer CU may operate as the antenna substrate for the operation of the antenna pattern ANT. In such an embodiment, a bandwidth capable of radiating the frequency of the antenna pattern ANTe may be increased. Thus, an electronic device DD-2 may have improved frequency signal radiation performance.

Figure 24:
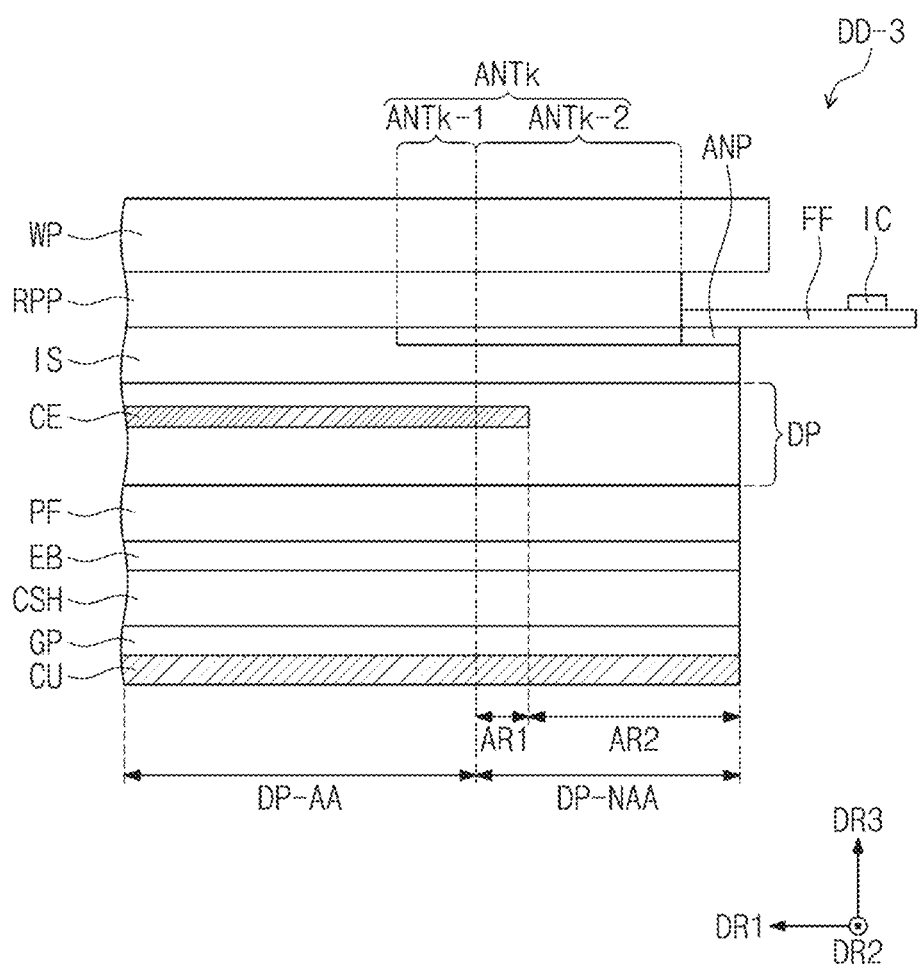

FIG. 24 is a cross-sectional view of an electronic device according to an embodiment of the invention. In FIG. 24, the same or like reference numerals are used to indicate the same or like components as those described above with reference to FIG. 8, and any repetitive detailed descriptions thereof will be omitted or simplified.

Referring to FIG. 24, in an embodiment of an electronic device DD-3, a plurality of antenna patterns ANTk may include a first portion ANTk-1 and a second portion ANTk-2. The first portion ANTk-1 may overlap the active area DP-AA in the third direction DR3. The first portion ANTk-1 may have a mesh structure in which an opening is defined. A surface area of the opening may be greater than that of the pixel PX (see FIG. 3). Thus, an image provided on the active area DP-AA may be transmitted through the opening. The antenna pattern ANTk may be deformed into various shapes in an area overlapping the active area DP-AA, and a design of freedom of the antenna pattern ANTk may be improved.

Even if an electronic device DD-3 is miniaturized or thinned, or a surface area of the peripheral area DP-NAA is reduced, since the surface area of the active area DP-AA is secured, a space in which the antenna pattern ANTk is disposed may be easily secured.

In embodiments of the invention, as described herein, the antenna pattern may not overlap the common electrode. The cover layer may overlap the antenna pattern and the antenna pad. The cover layer may operate as the ground electrode for the antenna pattern. The protective layer, the emboss layer, the cushion layer, and the heat dissipation sheet, along with the layers of the display panel and the sensor layer, which are disposed between the antenna pattern and the cover layer, may operate as the antenna substrate for the operation of the antenna pattern. In such embodiments, the thickness of the antenna substrate for the operation of the antenna pattern may be secured, and the bandwidth capable of radiating the frequency of the antenna pattern may increase. Thus, in such embodiments, the electronic device may have the improved frequency signal radiation performance.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
a display layer in which an active area and a peripheral area adjacent to the active area are defined, wherein the display layer comprises a common electrode;
a sensor layer disposed on the display layer, wherein the sensor layer comprises a plurality of sensing electrodes and an antenna pattern comprising an antenna and an antenna line; and
a cover layer disposed under the display layer, wherein the cover layer has a conductivity,
wherein the peripheral area comprises a first area and a second area spaced apart from the active area with the first area therebetween,
the common electrode is disposed in the active area and the first area and is spaced apart from the second area,
when viewed in a plan view, the antenna pattern does not overlap the common electrode, and
when viewed in the plan view, the cover layer overlaps the antenna pattern and the common electrode, and when viewed in the plan view, an entire portion of the antenna and an entire portion of the antenna line does not overlap the common electrode,
the antenna is configured to radiate a frequency signal, and
the antenna line is configured to feed the antenna.

2. The electronic device of claim 1, wherein
the antenna pattern comprises a first portion and a second portion adjacent to the first portion,
wherein the second portion has a mesh structure.

3. The electronic device of claim 2, wherein the antenna pattern comprises a dipole antenna.

4. The electronic device of claim 1, wherein
a groove is defined in the common electrode in a direction away from a side surface of the display layer, and
when viewed in the plan view, the antenna pattern is disposed in the groove and is spaced apart from the common electrode.

5. The electronic device of claim 1, wherein a plurality of openings is defined in the common electrode.

6. The electronic device of claim 1, wherein the second area has a width of about 300 μm or greater.

7. The electronic device of claim 1, further comprising:
a protective layer disposed between the cover layer and the display layer.

8. The electronic device of claim 1, wherein
when viewed in the plan view, the antenna pattern overlaps the active area and the peripheral area, and
a portion of the antenna pattern, which overlaps the active area, has a mesh structure.

9. An electronic device comprising:
a sensor layer comprising a plurality of sensing electrodes and an antenna pattern disposed in a same layer as some of the plurality of sensing electrodes;
a display layer disposed below the sensor layer, wherein the display layer comprises a common electrode and a plurality of pixels; and
a cover layer disposed below the display layer and having a conductivity,
wherein, when viewed in a plan view, the antenna pattern non-overlaps the common electrode and overlaps the cover layer;
wherein the antenna pattern comprises an antenna and an antenna line, and
wherein when viewed in the plan view, the cover layer overlaps the common electrode, and when viewed in the plan view, an entire portion of the antenna and an entire portion of the antenna line does not overlap the common electrode,
the antenna is configured to radiate a frequency signal, and
the antenna line is configured to feed the antenna.

10. The electronic device of claim 9, wherein a distance between a side surface of the display layer and the common electrode is about 300 μm or greater.

11. The electronic device of claim 9, further comprising:
a protective layer disposed between the cover layer and the display layer.

12. The electronic device of claim 1, wherein at least some of the plurality of sensing electrodes and the antenna pattern are disposed in a same layer as each other.

13. The electronic device of claim 1, wherein, when viewed in the plan view, the antenna pattern overlaps the second area.

* * * * *